(12) United States Patent
Kawai et al.

(10) Patent No.: US 12,190,950 B2
(45) Date of Patent: Jan. 7, 2025

(54) VARIABLE RESISTANCE NONVOLATILE STORAGE DEVICE AND WRITE METHOD THEREFOR

(71) Applicant: Nuvoton Technology Corporation Japan, Kyoto (JP)

(72) Inventors: Ken Kawai, Osaka (JP); Koji Katayama, Nara (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 189 days.

(21) Appl. No.: 18/057,067

(22) Filed: Nov. 18, 2022

(65) Prior Publication Data

US 2023/0081445 A1 Mar. 16, 2023

Related U.S. Application Data

(63) Continuation of application No. PCT/JP2021/022553, filed on Jun. 14, 2021.

(30) Foreign Application Priority Data

Jul. 9, 2020 (JP) .................................. 2020-118177

(51) Int. Cl.
  *G11C 13/00* (2006.01)
(52) U.S. Cl.
  CPC ...... *G11C 13/0069* (2013.01); *G11C 13/0007* (2013.01); *G11C 13/003* (2013.01);
  (Continued)
(58) Field of Classification Search
  CPC ............ G11C 13/0069; G11C 13/0007; G11C 13/003; G11C 2013/0078; G11C 2213/32;
  (Continued)

(56) References Cited

U.S. PATENT DOCUMENTS 10,541,011 B1 * 1/2020 Hong .................. G11C 11/1655
10,783,941 B1 * 9/2020 Kavalipurapu ........ G11C 5/147
(Continued)

FOREIGN PATENT DOCUMENTS

JP   2012-027972 A   2/2012
JP   2016-021272 A   2/2016
WO  2011/045886 A1  4/2011

OTHER PUBLICATIONS

International Search Report issued on Sep. 7, 2021 in International Patent Application No. PCT/JP2021/022553, with English translation.

(Continued)

*Primary Examiner* — Michael T Tran
(74) *Attorney, Agent, or Firm* — Rimon P.C.

(57) ABSTRACT

A variable resistance nonvolatile storage device includes: a variable resistance element having a state reversibly changeable between a high resistance state and a low resistance state; and a current supply circuit that supplies the variable resistance element with a low-resistance changing current for changing the state from the high resistance state to the low resistance state. The low-resistance changing current has a waveform that includes a first period and a second period along a time axis, the second period being subsequent to the first period. The current supply circuit applies to the variable resistance element: a first current during the first period; and a second current during the second period, the second current being smaller than the first current. The first current is not zero at an end of the first period, and the second current is not zero at a start of the second period.

18 Claims, 18 Drawing Sheets

(52) U.S. Cl.
CPC ............... *G11C 2013/0078* (2013.01); *G11C 2213/32* (2013.01); *G11C 2213/72* (2013.01); *G11C 2213/79* (2013.01)

(58) Field of Classification Search
CPC ............ G11C 2213/72; G11C 2213/79; G11C 13/0026; G11C 13/0011; G11C 2013/0083
USPC ................................................. 365/148, 158
See application file for complete search history.

(56) References Cited

U.S. PATENT DOCUMENTS

| | | | | |
|---|---|---|---|---|
| 11,145,349 | B1* | 10/2021 | Pawlak | ................... G06F 21/78 |
| 2006/0220071 | A1* | 10/2006 | Kang | ................. G11C 13/0004 |
| | | | | 257/248 |
| 2011/0103131 | A1* | 5/2011 | Katayama | .............. H10B 63/84 |
| | | | | 257/E45.001 |
| 2011/0216577 | A1 | 9/2011 | Tomotani et al. | |
| 2011/0233509 | A1* | 9/2011 | Shigeoka | ............. H10N 70/826 |
| | | | | 257/4 |
| 2012/0020141 | A1 | 1/2012 | Kitagawa et al. | |
| 2012/0230080 | A1 | 9/2012 | Chang et al. | |
| 2013/0163349 | A1 | 6/2013 | Ahn et al. | |
| 2013/0208529 | A1* | 8/2013 | Tomotani | ............... G11C 29/76 |
| | | | | 365/148 |
| 2014/0104925 | A1* | 4/2014 | Azuma | ................ G11C 13/004 |
| | | | | 365/148 |
| 2014/0268993 | A1* | 9/2014 | Chiang | .............. G11C 13/0007 |
| | | | | 365/148 |
| 2015/0364193 | A1 | 12/2015 | Shimakawa et al. | |
| 2016/0148664 | A1* | 5/2016 | Katoh | ................... H04L 9/0866 |
| | | | | 365/148 |
| 2020/0234760 | A1* | 7/2020 | Miyamura | ............. H03K 17/00 |
| 2021/0064974 | A1* | 3/2021 | Kim | ....................... G06N 3/082 |
| 2021/0151678 | A1* | 5/2021 | Lee | .................... H10N 70/8845 |
| 2021/0193223 | A1* | 6/2021 | Em | ...................... G11C 13/0069 |
| 2021/0287743 | A1* | 9/2021 | Domae | ................ H10N 70/826 |

OTHER PUBLICATIONS

Akifumi Kawahara, et. al., "Filament Scaling Forming Technique and Level-Verify-Write Scheme with Endurance Over 107Cycles in ReRAM," 2013 IEEE International Solid-State Circuits Conference 12.6, Feb. 19, 2013, Figure 12.6.4.

* cited by examiner

FIG. 14

| Power supply | Voltage | Set voltage value |
|---|---|---|
| External power supply | VDD | 3.3 V |
| Low-resistance changing word line power supply | VwL | 3.0 V |
| High-resistance changing word line power supply | VwH | 1.8 V |
| Read word line power supply | Vr | 1.1 V |
| Low-resistance changing clamp power supply | Vc1/Vc2/Vclamp | 1.73 V |
| Low-resistance changing pulse power supply | VdL | 2.8 V |
| High-resistance changing pulse power supply | VdH | 1.7 V |
| Precharge power supply | VPR | 1.1 V |

VARIABLE RESISTANCE NONVOLATILE STORAGE DEVICE AND WRITE METHOD THEREFOR

CROSS REFERENCE TO RELATED APPLICATIONS

This is a continuation application of PCT International Application No. PCT/JP2021/022553 filed on Jun. 14, 2021, designating the United States of America, which is based on and claims priority of Japanese Patent Application No. 2020-118177 filed on Jul. 9, 2020. The entire disclosures of the above-identified applications, including the specifications, drawings and claims are incorporated herein by reference in their entirety.

FIELD

The present disclosure relates to a variable resistance nonvolatile storage device that includes a memory cell that includes a variable resistance storage element having a resistance that reversibly changes based on an electric signal, and a write method therefor.

BACKGROUND

In recent years, there have been progressive research and development on a variable resistance nonvolatile storage device that includes a memory cell configured using a variable resistance nonvolatile storage element. A variable resistance nonvolatile storage element refers to an element that has a property that its resistance reversibly changes according to, for instance, an electrical signal and furthermore, can store data associated with the resistance in a nonvolatile manner. A resistive random access memory (ReRAM) based on a change in electrical resistance according to an oxidation-reduction reaction, a magnetoresistive RAM (MRAM) based on a change in magnetic resistance, and a phase change RAM (PCRAM) based on a change in electrical resistance due to a phase change, for instance, each correspond to a variable resistance nonvolatile storage device.

With regard to such variable resistance nonvolatile storage devices, it is known that the resistance thereof can be controlled by and operation thereof can be stabilized by controlling an amount of current that flows through a variable resistance nonvolatile storage element and a value of a voltage applied thereto during writing operation thereof. Such a variable resistance nonvolatile storage device is disclosed in Patent Literature (PTL) 1, for example.

CITATION LIST

Patent Literature

PTL 1: Japanese Unexamined Patent Application Publication No. 2012-27972

SUMMARY

Technical Problem

However, a conventional variable resistance nonvolatile storage device has a problem that, for example, when power consumption is to be reduced along with miniaturization of a variable resistance element, if a write current for changing the state of the variable resistance element from the high resistance state to the low resistance state is reduced, an initial operation window cannot be sufficiently ensured. Here, an operation window refers to a difference between a read current obtained in the high resistance state and a read current obtained in the low resistance state. If this difference is sufficiently great, a stable read operation is ensured. On the contrary, the smaller the difference is, the higher a possibility that a read error occurs is. In addition, an operation window tends to deteriorate due to a high cycling operation, that is, a rewrite operation performed multiple times (for example, 100,000 times). Here, the initial operation window refers to an operation window during a rewrite operation in an initial period (from the first time the rewrite operation is performed until the rewrite operation is performed tens of or hundreds of times, for example).

On the other hand, if the above write current for changing to the low resistance is increased, the initial operation window can be ensured, yet the operation window apparently deteriorates due to the high cycling operation, which is a problem.

In view of this, the present disclosure provides a variable resistance nonvolatile storage device and a write method therefor, which can increase an initial operation window and reduce deterioration of an operation window due to a rewrite operation performed multiple times.

Solution to Problem

A variable resistance nonvolatile storage device according to an aspect of the present disclosure includes: a variable resistance element having a state reversibly changeable between a high resistance state and a low resistance state; and a current supply circuit that supplies the variable resistance element with a low-resistance changing current for changing the state from the high resistance state to the low resistance state. A waveform of the low-resistance changing current is a descending step form.

Advantageous Effects

According to the variable resistance nonvolatile storage device according to the present disclosure, an initial operation window can be increased, and deterioration of an operation window due to a rewrite operation performed multiple times can be reduced.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 14 illustrates drive conditions for the variable resistance nonvolatile storage device in the embodiment.

Figure 1A:
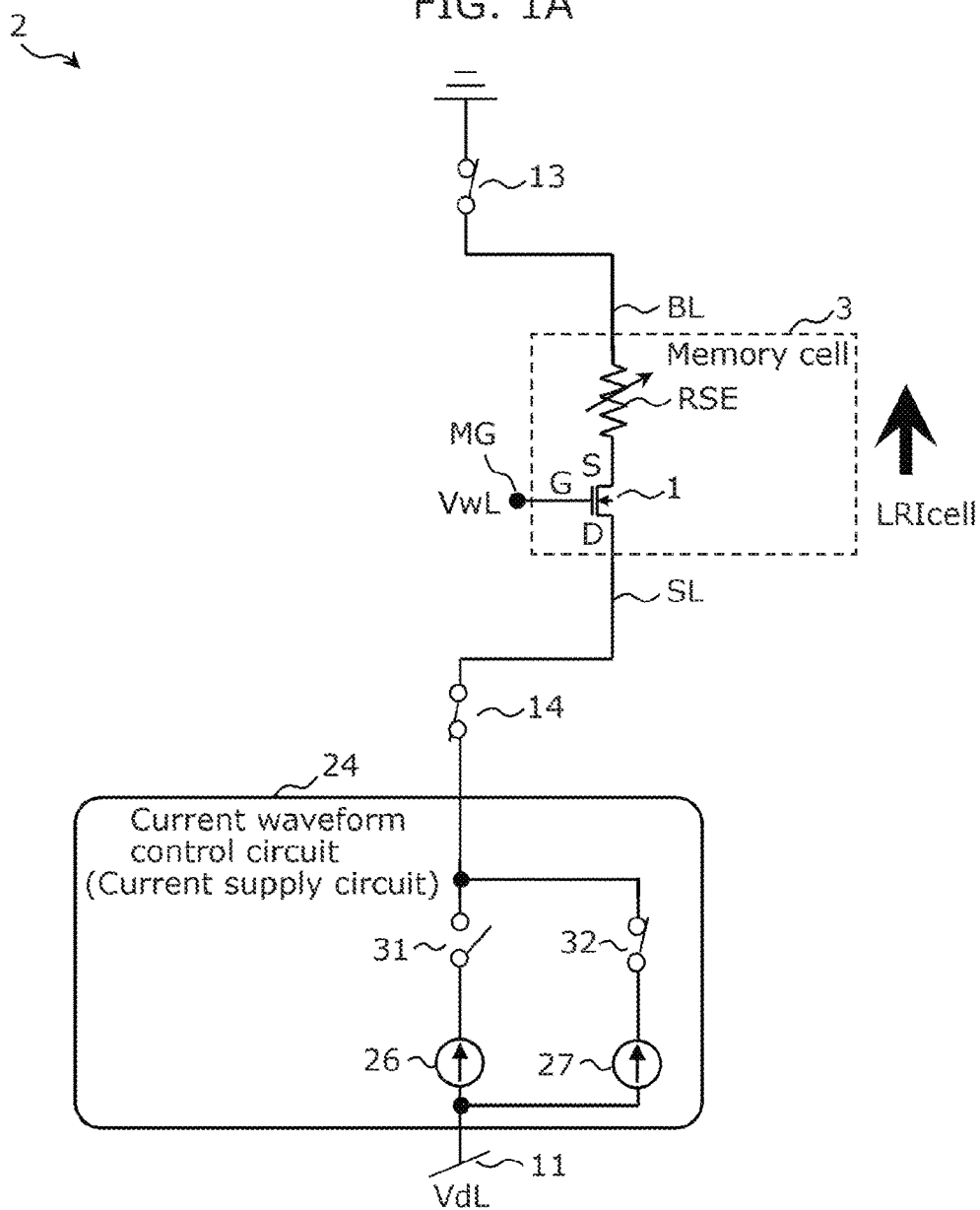
FIG. 1A illustrates an example of a configuration of a principal part of a variable resistance nonvolatile storage device in an embodiment.

DESCRIPTION OF EMBODIMENTS (Underlying Knowledge Forming Basis of the Present Disclosure)

The inventors of the present application found that the variable resistance nonvolatile storage device described in the "Background" section has problems as follows.

PTL 1 discloses a drive circuit (a pass transistor) and a drive method that are suitable for parallel drive for a low-resistance changing operation and a high-resistance changing operation in a storage device that includes a 1T1R memory cell in which a variable resistance nonvolatile storage element and a transistor are connected. A variable resistance nonvolatile storage element includes an insulator film that includes, for instance, SiN, SiO2, or Gd2O3, and a conductor film such as a metal film, an alloy film, or a metal compound film that contains a metal element such as Cu, Ag, Zr, or Al.

Here, a resistance of a variable resistance nonvolatile storage element can be set to a desired low resistance according to a value of a current that drives the variable resistance nonvolatile storage element. Further, if a current that drives the variable resistance nonvolatile storage element is limited to prevent an excessive current from flowing through the variable resistance nonvolatile storage element, deterioration of the variable resistance nonvolatile storage element can be reduced.

By the way, recently, research on a variable resistance nonvolatile storage device such as ReRAM has been actively conducted. That is because a rewrite operation and a read operation can be performed at a higher speed than flash memory that has been the mainstream of a conventional nonvolatile storage device. Furthermore, the number of times flash memory is rewritten used to be about 100,000 times, but is decreased down to about several thousands of times along with progressive miniaturization and increase in capacity. Yet, ReRAM that is assumed to have high rewrite capability is expected as a nonvolatile storage device that substitutes for flash memory, also in this respect.

However, the disclosure of the conventional variable resistance nonvolatile storage device is about a method for setting the resistance of a variable resistance nonvolatile storage element to a desired resistance and reduction of damage and deterioration of a variable resistance nonvolatile storage element by limiting a current so as to prevent an excessive current from being applied due to a rewrite operation of the variable resistance nonvolatile storage element. Thus, the conventional technology does not disclose or accomplish a task of achieving both of an increase in an operation window of a cell current between the low resistance state and the high resistance state for achieving a stable operation and a great number of times rewrite operation is performed.

In view of this, the present disclosure provides a variable resistance nonvolatile storage device and a write method therefor, which can increase an initial operation window and reduce deterioration of an operation window due to a rewrite operation performed multiple times.

In order to address the above problems, a variable resistance nonvolatile storage device according to an aspect of the present disclosure includes: a variable resistance element having a state reversibly changeable between a high resistance state and a low resistance state; and a current supply circuit that supplies the variable resistance element with a low-resistance changing current for changing the state from the high resistance state to the low resistance state. The low-resistance changing current has a waveform that includes a first period and a second period along a time axis, the second period being subsequent to the first period. Current supply circuit 24 applies to the variable resistance element: a first current during the first period; and a second current during the second period, the second current being smaller than the first current. The first current is not zero at an end of the first period, and the second current is not zero at a start of the second period.

According to this, an initial operation window can be increased, and deterioration of an operation window due to a rewrite operation performed multiple times can be reduced.

EMBODIMENTS

The following specifically describes embodiments with reference to the drawings.

Note that the embodiments described below each show a general or specific example. The numerical values, shapes, materials, elements, the arrangement and connection of the elements, steps, and the processing order of the steps, for instance, described in the following embodiments are examples, and thus are not intended to limit the present disclosure. Further, among the elements in the following embodiments, elements not recited in any of the independent claims each showing an embodiment according to an aspect of the present disclosure are described as arbitrary elements. The embodiments of the present disclosure are not limited to the ones defined by current independent claims, and can be represented by other independent claims.

1. Example of Schematic Configuration

FIG. 1A illustrates an example of a configuration of a principal part of variable resistance nonvolatile storage device 2 in an embodiment. The drawing illustrates a circuit involved in a low resistance write operation for changing the state of a variable resistance nonvolatile storage element from a high resistance state to a low resistance state, as a principal configuration of the present disclosure. In addition, the drawing omits a circuit involved in a high resistance write operation, which is not a principal part of the present disclosure. Variable resistance nonvolatile storage device 2 illustrated in the drawing includes memory cell 3, low-resistance (LR) changing bit line (BL) selection switch 13, LR changing source line (SL) selection switch 14, and current waveform control circuit 24.

Memory cell 3 includes variable resistance nonvolatile storage element RSE and memory cell transistor 1 connected in series. Note that the drawing illustrates memory cell 3 as one representative memory cell in a memory array that includes plural memory cells 3 disposed in a matrix. Variable resistance nonvolatile storage element RSE may be simply referred to as variable resistance element RSE in the following.

Variable resistance element RSE has a state that can be reversibly changed between the high resistance state and the low resistance state, and functions as a readable/writable storage element by associating the high resistance state and the low resistance state with digital binary values. Variable resistance nonvolatile storage element RSE has one terminal connected to source S of memory cell transistor 1, and another terminal connected to bit line BL.

Memory cell transistor 1 includes drain D, source S, and gate G. Drain D is connected to source line SL. Gate G is connected to memory cell gate terminal MG. Source S is connected to the one terminal of variable resistance element RSE. Note that the drain and the source of the transistor may be either side with the gate being provided therebetween. Yet in this Specification, the side connected to variable resistance nonvolatile storage element RSE is defined as source S.

During a period when a low resistance write operation is performed, voltage VwL illustrated in the drawing is applied to memory cell gate MG. Accordingly, this places memory cell transistor 1 into the on state.

LR changing BL selection switch 13 and LR changing SL selection switch 14 are both placed in the on state during the period for the low resistance write operation.

Current waveform control circuit 24 is a current supply circuit, and supplies the variable resistance element with low-resistance changing current LRIcell for changing the state of the variable resistance element from the high resistance state to the low resistance state. Low-resistance changing current LRIcell has a descending step waveform. Current waveform control circuit 24 performs driving to decrease a constant current during the low resistance write operation in two stages, by causing low-resistance changing current LRIcell to have a descending step waveform. This driving is referred to as constant current two-stage decrease driving. According to this driving, in a write operation for changing a state from the high resistance state to the low resistance state, deterioration of an initial window can be reduced, and deterioration of an operation window can be reduced at the time of high cycling (when rewrite is performed 100,000 times, for example). For example, even when miniaturization is achieved, a stable rewrite operation having high reliability can be performed for a long period.

Next, a specific example of a waveform of a low-resistance changing current is to be described.

Figure 1B:
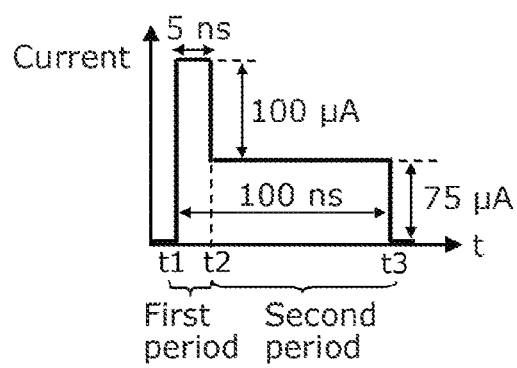
FIG. 1B illustrates an example of a waveform of a low-resistance changing current.

FIG. 1B illustrates an example of a waveform of a low-resistance changing current. As illustrated in FIG. 1B, a descending step current waveform includes a first period and a second period subsequent to the first period. A current supply circuit, that is, current waveform control circuit 24 supplies variable resistance element RSE with a first constant current during the first period, and supplies variable resistance element RSE with a second constant current smaller than the first constant current during the second period.

Accordingly, the current supply circuit, that is, current waveform control circuit 24 includes LR changing current limiting element 26 that is a first constant current source, and LR changing current limiting element 27 that is a second constant current source. Current waveform control circuit 24 generates the first constant current by superimposing a constant current from the first constant current source and a constant current from the second constant current source during the first period. Current waveform control circuit 24 generates the second constant current that is a constant current from one of the first constant current source or the second constant current source during the second period.

Furthermore, the current supply circuit, that is, current waveform control circuit 24 includes a first switch (that is constant current control switch 31) connected in series to the first constant current source, and a second switch (that is, constant current control switch 32) connected in series to the second constant current source. Current waveform control circuit 24 supplies variable resistance element RSE with the first constant current by placing both the first switch and the second switch in the conductive state during the first period. Current waveform control circuit 24 supplies variable resistance element RSE with the second constant current by placing one of the first switch or the second switch in the non-conductive state and placing a remaining one of the first switch or the second switch in the conductive state during the second period.

According to this, during the first period, a current having a greater value than during the second period is supplied to variable resistance element RSE, and thus an initial window can be sufficiently ensured. During the second period, a current having a smaller value than the first period is supplied to the variable resistance element, and thus deterioration of a window at the time of high cycling can be reduced. Further, a descending step current waveform can be readily generated by the operation of the first switch and the second switch.

As illustrated in FIG. 1B, the first period is shorter than the second period. For example, the first period may be at most 10% of the second period. In this manner, an operation window can be increased during the first period when the relatively great first constant current is supplied, and deterioration of an operation window due to high cycling operation can be reduced during the second period when the relatively small second constant current is supplied. Even if the first period is a transient phenomenal period having a length that is 10% or less of the second period, an operation window can be sufficiently increased. More specifically, the first period may be at most 5 ns, and the second period may be at least 50 ns. In this manner, a write operation for changing the state to the low resistance state can be performed at high speed.

The second constant current may be at most 60% of the first constant current. In this manner, a write operation for changing the state to the low resistance state can be performed using less power. More specifically, the first constant current may be at least 125 μA, and the second constant current may be at most 75 μA. In this manner, a write operation for changing the state to the low resistance state can be performed using less power.

1.1 Example of Detailed Configuration

Next, an example of a more detailed configuration of variable resistance nonvolatile storage device 2 is to be described.

Figure 2A:
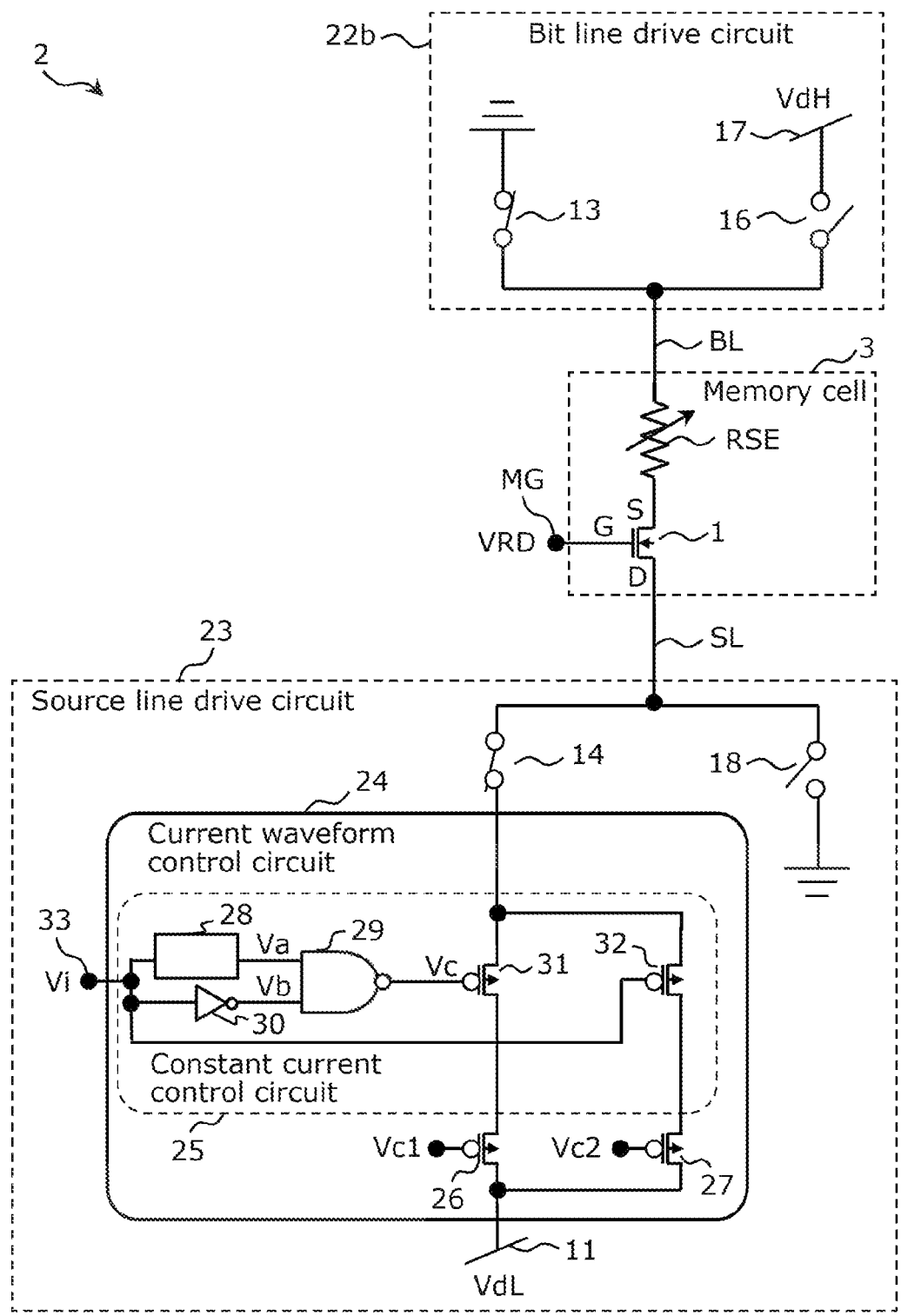
FIG. 2A illustrates an example of a more detailed configuration of the principal part of the variable resistance nonvolatile storage device in the embodiment.

FIG. 2A illustrates an example of a detailed configuration of variable resistance nonvolatile storage device 2 according to the embodiment.

FIG. 2A clearly illustrates also circuits involved in a high resistance write operation, which are omitted in FIG. 1A, and illustrates specific examples of current waveform control circuit 24 and circuits in the vicinity thereof.

Variable resistance nonvolatile storage device 2 illustrated in FIG. 2A includes memory cell 3, bit line drive circuit 22b, and source line drive circuit 23.

Memory cell 3 is as illustrated in FIG. 1A, which is already described, and thus a description thereof is not repeated here.

Bit line drive circuit 22b includes LR changing BL selection switch 13 and HR changing BL selection switch 16, and is connected to memory cell 3 via bit line BL.

LR changing BL selection switch 13 connects the ground and bit line BL, and is placed in the on state during a low-resistance changing operation.

HR changing BL selection switch 16 connects HR changing power supply terminal 17 and bit line BL, and is placed in the on state during a high-resistance changing operation. Thus, HR changing BL selection switch 16 is for supplying memory cell 3 with a high-resistance changing current pulse for changing the state of memory cell 3 to the high resistance state.

Voltage VdH for generating a high-resistance changing pulse voltage is applied to HR changing power supply terminal 17.

Source line drive circuit 23 includes LR changing power supply terminal 11, LR changing SL selection switch 14, HR changing SL selection switch 18, current waveform control circuit 24, and write pulse width control terminal 33. Source line drive circuit 23 supplies variable resistance element RSE with a low-resistance changing current. A low-resistance changing current has a descending step waveform, rather than a single rectangular pulse waveform.

Voltage VdL for generating a low-resistance changing pulse voltage is applied to LR changing power supply terminal 11.

LR changing SL selection switch 14 is connected to source line SL and a current supply terminal of current waveform control circuit 24, and is placed in the on state during a period for the low-resistance changing operation. The current supply terminal of current waveform control circuit 24 refers to a connection point between constant current control switch 31 and constant current control switch 32.

HR changing SL selection switch 18 connects the ground and source line SL, and is placed in the on state during a period for the high-resistance changing operation.

Current waveform control circuit 24 shows an example of a more specific circuit of the current supply circuit, that is, current waveform control circuit 24 illustrated in FIG. 1A. Current waveform control circuit 24 in FIG. 2A includes constant current control circuit 25, LR changing current limiting element 26, and LR changing current limiting element 27. Current waveform control circuit 24 includes constant current control circuit 25, and LR changing current limiting elements 26 and 27 that are PMOS transistors.

Constant current control circuit 25 includes delay circuit 28 having a first delay time (5 ns, for example), NAND circuit 29, inverter 30, and constant current control switches 31 and 32 that are PMOS transistors.

Write pulse width control terminal 33 is connected to an input terminal of delay circuit 28, an input terminal of inverter 30, and a gate terminal of constant current control switch 32. One of input terminals of NAND circuit 29 is connected to the output terminal of delay circuit 28. The other of the input terminals of NAND circuit 29 is connected to the output terminal of inverter 30. The output terminal of NAND circuit 29 is connected to the gate terminal of constant current control switch 31. LR changing current limiting elements 26 and 27 have source terminals both connected to LR changing power supply terminal 11, and drain terminals connected to source terminals of constant current control switches 31 and 32, respectively. Furthermore, constant current control switches 31 and 32 have drain terminals both connected to LR changing SL selection switch 14.

LR changing current limiting element 26 is a PMOS transistor, and clamp voltage Vc1 (<VdL) is applied to the gate terminal thereof. LR changing current limiting element 27 is a PMOS transistor, and clamp voltage Vc2 (<VdL) is applied to the gate terminal thereof. Accordingly, LR changing current limiting elements 26 and 27 serve as substantially constant current sources owing to current saturation region characteristics of LR changing current limiting elements 26 and 27, and can limit currents to constant current Iset1 (100 μA, for example) and constant current Iset2 (75 μA, for example), respectively. Thus, the size of the transistors and the gate voltages are set so that output currents from LR changing current limiting elements 26 and 27 are limited to constant currents Iset1 and Iset2, respectively. For example, the lengths of the PMOS transistors of LR changing current limiting elements 26 and 27 are the same, and the ratio of the widths of the transistors of LR changing current limiting elements 26 and 27 are set to 4:3. In this manner, when Vc1=Vc2, Iset1:Iset2 is 4:3.

Write pulse width control terminal 33 is a terminal for inputting voltage Vi for designating a timing for applying a low-resistance changing current for changing to a low resistance and a pulse width (that is, an LR write pulse width).

Constant current control switch 31 is a first switch connected in series to LR changing current limiting element 26, that is, a first current source, and is placed in the on state during the first period according to pulse voltage Vc.

Constant current control switch 32 is a second switch connected in series to LR changing current limiting element 27, that is, a second current source, and is placed in the on state during the second period according to pulse voltage Vi.

Figure 2B:
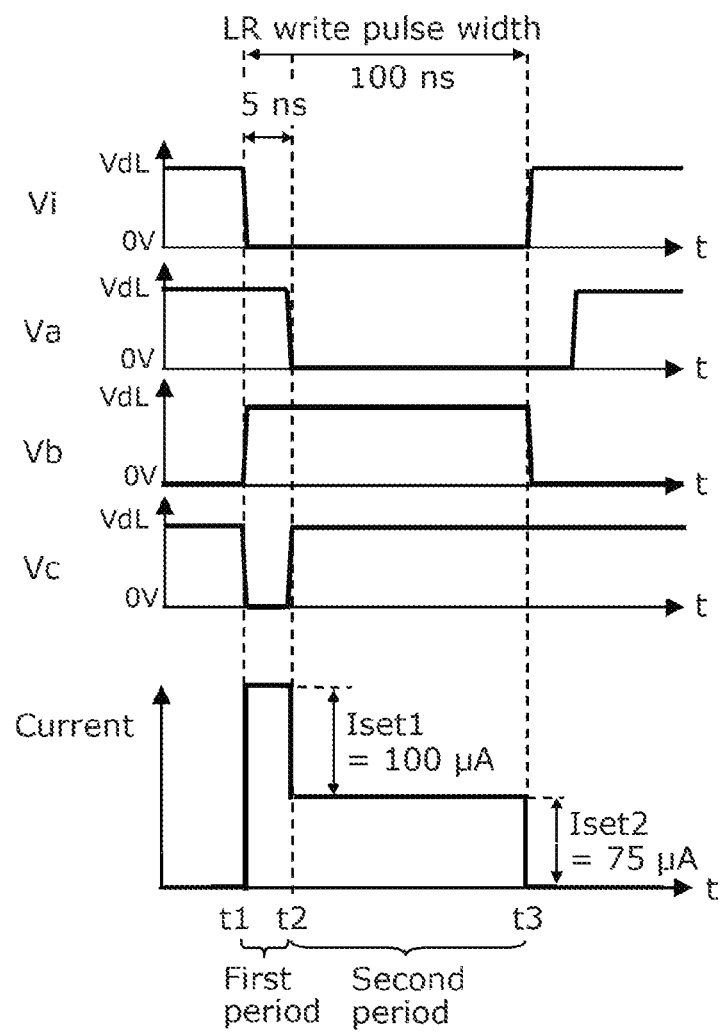
FIG. 2B is a timing chart illustrating an operation of a constant current control circuit in the embodiment.

A circuit that includes delay circuit 28, NAND circuit 29, and inverter 30 is a control circuit that controls a conductive state and a non-conductive state of the first switch, that is, constant current control switch 31. This circuit is for generating negative logic pulse voltage Vc obtained by differentiating a leading edge of negative logic pulse voltage Vi input through write pulse width control terminal 33, as illustrated in FIG. 2B. The pulse width of negative logic pulse voltage Vc determines the first period during which constant current control switch 31 is placed in the on state. The pulse width of negative logic pulse voltage Vi determines the second period during which constant current control switch 32 is placed in the on state.

When the state of memory cell 3 is changed to a low resistance state, LR changing BL selection switch 13 and LR changing SL selection switch 14 are placed in the on state for a predetermined period, and HR changing BL selection switch 16 and HR changing SL selection switch 18 are placed in the off state. After that, by applying, to write pulse width control terminal 33, negative logic voltage pulse Vi having a pulse width for a predetermined period (100 ns, for example), output voltage Va from delay circuit 28 becomes a voltage pulse resulting from delaying voltage pulse Vi for 5 ns, as illustrated in FIG. 2B. Output voltage Vb from inverter 30 is a voltage pulse resulting from logically inverting voltage pulse Vi. Output voltage Vc from NAND circuit 29 is a result of NAND operation on output voltage Vc and output voltage Vb, and becomes a negative logic voltage pulse having a width that is a first delay time (5 ns, for example).

Accordingly, at time t1 when changing to the low resistance starts, constant current control switches 31 and 32 are both activated so as to be placed in the on stated for 5 ns, and an LR write current is limited, by both LR changing current limiting elements 26 and 27, to a total (175 µA, for example) of constant current Iset1 (100 µA) and constant current Iset2 (75 µA). At time t2, constant current control switch 32 maintains the on state, and constant current control switch 31 is turned off. After that, during the remaining period for 95 ns (t2 to t3), only constant current control switch 31 is placed in the off state, and LR changing current limiting element 27 reduces an LR write current to constant current Iset2 (75 µA). In this manner, the LR write current is caused to flow from the source line SL side to the bit line BL side while being reduced in two stages. In this manner, current waveform control circuit 24 supplies variable resistance element RSE with a low-resistance changing current having a descending step waveform as illustrated in FIG. 2B, as a low-resistance changing operation.

When the state of memory cell 3 is changed to a high resistance state, LR changing BL selection switch 13 and LR changing SL selection switch 14 are placed in the off state, and HR changing BL selection switch 16 and HR changing SL selection switch 18 are placed in the on state for a predetermined period, thereby causing a current to flow in a direction from bit line BL to source line SL.

Next, an example of a configuration of variable resistance nonvolatile storage element RSE is to be described.

Figure 3:
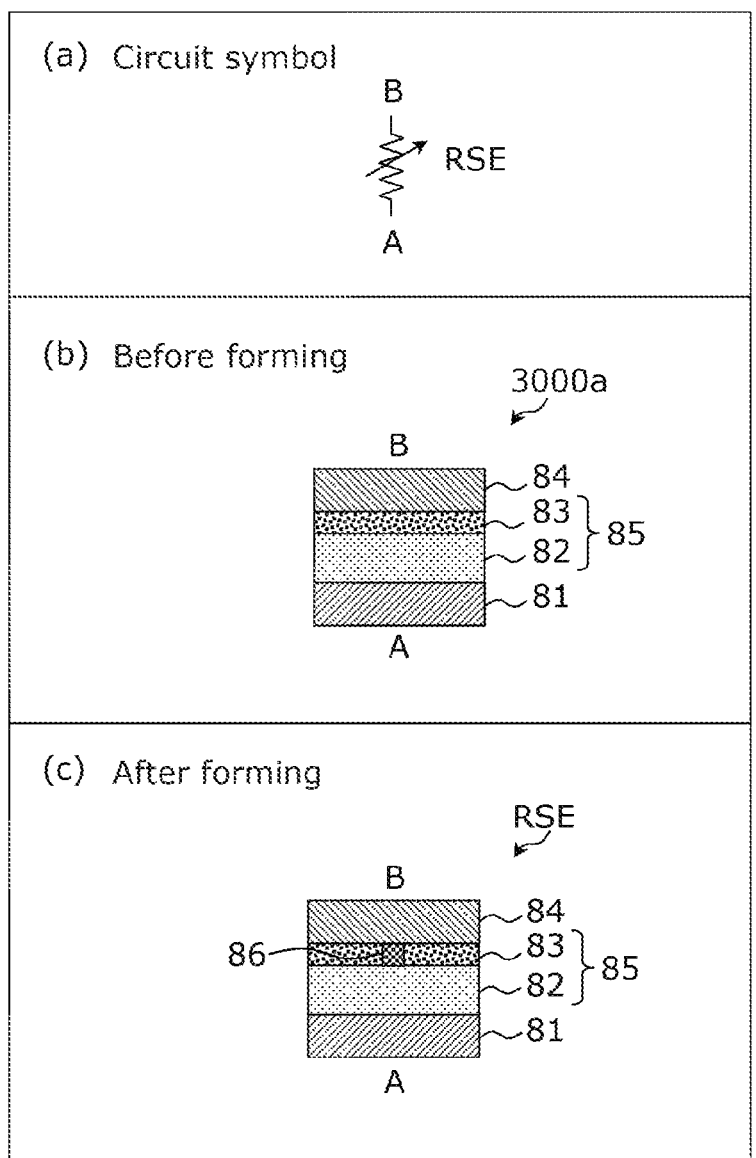
FIG. 3 is an explanatory drawing illustrating a circuit symbol and cross sections of a variable resistance nonvolatile storage element in the embodiment.

FIG. 3 is an explanatory drawing illustrating a circuit symbol and cross sectional structures of variable resistance nonvolatile storage element RSE in the embodiment.

As illustrated in (a) of FIG. 3, in variable resistance nonvolatile storage element RSE shown by the circuit symbol, a terminal on a side connected to source S of memory cell transistor 1 is terminal A, and a terminal connected to bit line BL is terminal B.

Variable resistance nonvolatile storage element 3000a illustrated in (b) of FIG. 3 shows a structure of variable resistance nonvolatile storage element RSE after being manufactured and before being subjected to forming.

Variable resistance nonvolatile storage element 3000a includes first electrode 81 (a lower electrode) on the terminal A side, second electrode 84 (an upper electrode) on the terminal B side, and variable resistance layer 85 that includes an oxygen-deficient transition metal oxide. Variable resistance layer 85 includes a stack of (i) first transition metal oxide layer 82 that includes an oxygen-deficient transition metal oxide and (ii) second transition metal oxide layer 83 that includes a transition metal oxide having oxygen deficiency lower than that of first transition metal oxide layer 82.

Variable resistance nonvolatile storage element RSE illustrated in (c) of FIG. 3 shows a structure after being subjected to forming. By applying electrical stress to variable resistance nonvolatile storage element 3000a before being subjected to forming, minute filament 86 serving as a conductive path is formed in a local region in second transition metal oxide layer 83. An oxidation-reduction reaction occurs in such minute filament 86, and a resistance thereof changes. Thus, a resistance changing phenomenon occurs. In the following, a resistance changing operation described in the present disclosure is owing to the structure of such variable resistance nonvolatile storage element RSE after being subjected to forming.

In the present embodiment, as an example thereof, transition metals of the same kind are used for first transition metal oxide layer 82 and second transition metal oxide layer 83, and an oxygen-deficient first tantalum oxide layer (hereinafter, referred to as a first Ta oxide layer) serving as first transition metal oxide layer 82 and a second tantalum oxide layer (hereinafter, referred to as a second Ta oxide layer) serving as second transition metal oxide layer 83 are stacked. When the first Ta oxide layer is denoted by TaOx, and the second Ta oxide layer is denoted by TaOy, x<y. The thickness of the second Ta oxide layer is preferably in a range from 1 nm to 10 nm. In the present embodiment, first electrode 81 is configured of a stack of titanium nitride (TiN) and tantalum nitride (TaN), and second electrode 84 is configured to include a noble metal material such as iridium (Ir), for example.

An oxygen-deficient transition metal oxide refers to an oxide having a lower oxygen content (an atomic ratio: a proportion of the number of oxygen atoms out of a total number of atoms) than an oxide having a stoichiometric composition. Normally, an oxide having a stoichiometric composition is an insulator or includes an extremely great resistance. For example, when a transition metal is Ta, the stoichiometric composition of the oxide is Ta2O5, and the ratio of the numbers of atoms of Ta to O(O/Ta) is 2.5. Thus, in an oxygen-deficient Ta oxide, the atomic ratio of Ta to O is greater than 0 and smaller than 2.5.

Here, the oxygen content of the second Ta oxide layer serving as second transition metal oxide layer 83 is higher than the oxygen content of the first Ta oxide layer serving as first transition metal oxide layer 82. In other words, the oxygen deficiency of the second Ta oxide layer is lower than the oxygen deficiency of the first Ta oxide layer. With regard to a transition metal, the oxygen deficiency refers to a proportion of oxygen deficient with respect to the amount of oxygen included in its oxide having the stoichiometric composition. For example, when a transition metal is tantalum (Ta), the composition of its stoichiometric oxide is Ta2O5, and thus can be expressed as TaO2.5. The oxygen deficiency of TaO2.5 is 0%. For example, the oxygen deficiency of an oxygen-deficient tantalum oxide having the composition of TaO1.5 is as follows: the oxygen deficiency= (2.5−1.5)/2.5=40%. In addition, the oxygen content is a ratio of the number of oxygen atoms included with respect to a total number of atoms included in the transition metal oxide. The oxygen content of Ta2O5 is a ratio of the number of oxygen atoms to a total number of atoms (O/(Ta+O)), and is 71.4 atm %. Thus, the oxygen content of the oxygen-deficient tantalum oxide is higher than 0 and is lower than 71.4 atm %.

A transition metal other than tantalum or a certain metal may be used for a metal included in variable resistance layer 85. Tantalum (Ta), titanium (Ti), hafnium (Hf), zirconium (Zr), niobium (Nb), or tungsten (W), for instance, can be used as a transition metal, and aluminum (Al), for instance, can be used as a metal. Since a transition metal can be placed in a plurality of oxidation states, and thus different resistance states can be created by oxidation-reduction reactions. For example, it has been successfully confirmed that the resistance of variable resistance layer 85 is stably changed at high speed in the case where a hafnium oxide is used, when x is in a range from 0.9 to 1.6 where the composition of a first hafnium oxide layer that is first transition metal oxide layer 82 is HfOx and furthermore when y has a value greater than the value of x where the composition of a second hafnium oxide layer that is second transition metal oxide layer 83 is HfOy. In this case, the thickness of the second hafnium oxide layer is preferably in a range from 3 nm to 4 nm. Further, it has been successfully confirmed that the resistance of variable resistance layer 85 is stably changed at high speed in the case where a zirconium oxide is used, when x is in a range from 0.9 to 1.4 where the composition of a first zirconium oxide layer that is first transition metal oxide layer 82 is ZrOx and furthermore when y has a value greater than the value of x where the composition of a second zirconium oxide layer that is second transition metal oxide layer 83 is ZrOy. In this case, the thickness of the second zirconium oxide layer is preferably in a range from 1 nm to 5 nm.

Note that in the example described above, variable resistance layer 85 has a stack structure of two layers, but may be configured of a single variable resistance layer that is an oxygen-deficient transition metal oxide layer.

Second electrode 84 connected to second transition metal oxide layer 83 having lower oxygen deficiency is made of a material having higher standard electrode potential than a transition metal included in second transition metal oxide layer 83 and the material included in first electrode 81. Examples of the material of second electrode 84 include platinum (Pt), iridium (Ir), and palladium (Pd). By adopting such a configuration, an oxidation-reduction reaction selectively occurs in second transition metal oxide layer 83 near the interface between second electrode 84 and second transition metal oxide layer 83, so that a stable resistance changing phenomenon can be caused to occur.

Further, as variable resistance layer 85, a stack structure that includes first transition metal oxide layer 82 that includes a first transition metal, and second transition metal oxide layer 83 that includes a second transition metal different from the first transition metal may be adopted. The second transition metal oxide layer has an oxygen deficiency lower than an oxygen deficiency of the first transition metal oxide layer. In other words, second transition metal oxide layer 83 has a resistance higher than a resistance of first transition metal oxide layer 82.

When different materials are used for the first transition metal and the second transition metal, the standard electrode potential of the second transition metal is preferably lower than the standard electrode potential of the first transition electrode. For example, a stable resistance changing operation can be performed by using an oxygen-deficient tantalum oxide for first transition metal oxide layer 82 and a titanium oxide (TiO2) for second transition metal oxide layer 83. Titanium (standard electrode potential=−1.63 eV) is a material having a standard electrode potential lower than tantalum (standard electrode potential=−0.6 eV). An oxidation-reduction reaction is more readily caused to occur in second transition metal oxide layer 83 by disposing, in second transition metal oxide layer 83, an oxide of a metal having a standard electrode potential lower than that of first transition metal oxide layer 82.

With the above structure, when a positive voltage is applied to second electrode 84 with reference to first electrode 81, an oxygen ion included in first transition metal oxide layer 82 moves into filament 86, thus causing an oxidation reaction. Accordingly, it is considered that the resistance of filament 86 increases, and the state changes to the high resistance state.

In contrast, when a negative voltage is applied to second electrode 84 with reference to first electrode 81, an oxygen ion in filament 86 is pushed toward first transition metal oxide layer 82, thus causing a reduction reaction to occur in filament 86. Accordingly, it is considered that the resistance of minute filament 86 decreases, and the state changes to the low resistance state.

By the way, second transition metal oxide layer 83 having a greater resistance than that of first transition metal oxide layer 82 is formed to have a resistance in a range from about several hundred MΩ to 1 GΩ, for example. On the other hand, the resistance of filament 86 is in a range from about a hundred kΩ to several MΩ even when the state is changed to the high resistance state by the oxidation reaction.

Accordingly, a voltage applied between first electrode 81 and second electrode 84 is divided by first transition metal oxide layer 82 and second transition metal oxide layer 83, and a higher voltage is applied to second transition metal oxide layer 83 having a greater resistance. Yet a current path caused thereby is not evenly formed in second transition metal oxide layer 83. Most of the current flows through a region of filament 86 having a lower resistance in second transition metal oxide layer 83. Accordingly, control of a current and a voltage that allows a resistance changing operation that occurs in filament 86 to be stably and continuously performed is important in the case of a variable resistance nonvolatile storage element that operates based on a filament model.

[2. Results of Experiments for Evaluation]

Next, results of experiments conducted to evaluate variable resistance nonvolatile storage device 2 in FIG. 2A are to be described. In the experiment, a variable resistance nonvolatile storage device illustrated in FIG. 13 is also used as an experiment target as a comparative example, in addition to variable resistance nonvolatile storage device 2 in FIG. 2A.

First, the variable resistance nonvolatile storage device according to the comparative example is to be described.

Figure 13:
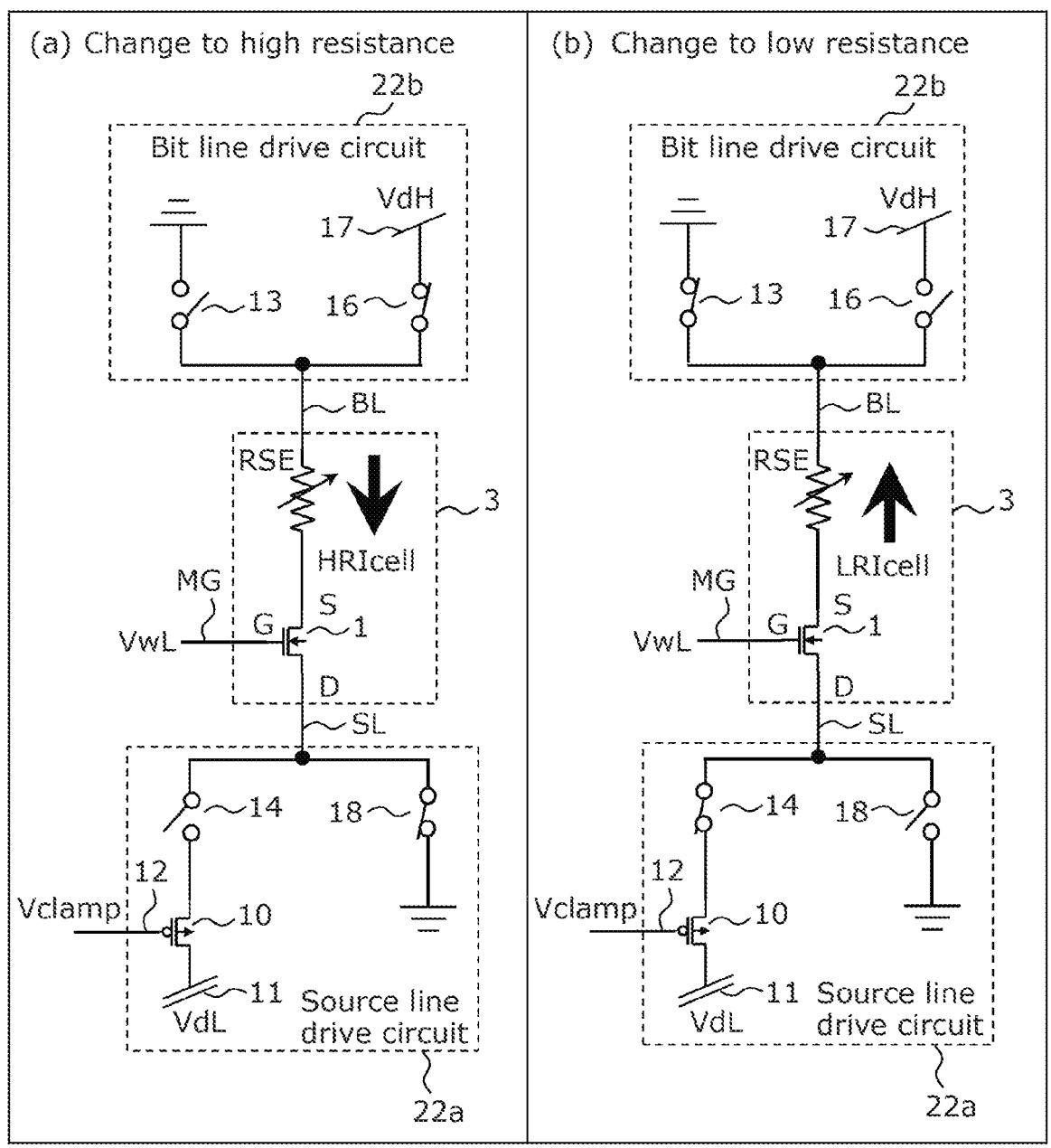
FIG. 13 illustrates a configuration of a variable resistance nonvolatile storage device as a comparative example.

FIG. 13 illustrates a configuration of the variable resistance nonvolatile storage device as a comparative example. This comparative example shows circuits similar to the variable resistance nonvolatile storage device according to PTL 1, and a 1T1R memory cell and circuits in the vicinity thereof. Part (a) of FIG. 13 illustrates a high-resistance changing operation. The thick arrow pointing downward represents current HRIcell supplied to variable resistance nonvolatile storage element RSE. Part (b) of FIG. 13 illustrates a low-resistance changing operation. The thick arrow pointing upward represents current LRIcell supplied to variable resistance nonvolatile storage element RSE.

The variable resistance nonvolatile storage device in FIG. 13 is mainly different from the device in FIG. 2A in that source line drive circuit 22a is provided instead of source line drive circuit 23.

Source line drive circuit 22a supplies memory cell 3 with a constant current rectangular wave single pulse in the low-resistance changing operation.

When the state of memory cell 3 is changed to the high resistance state, LR changing BL selection switch 13 and LR changing SL selection switch 14 are placed in the off state, and HR changing BL selection switch 16 and HR changing SL selection switch 18 are placed in the on state for a predetermined period, thereby causing current HRIcell to flow through memory cell 3 in a direction from bit line BL to source line SL.

When the stat of memory cell 3 is changed to the low resistance state, LR changing BL selection switch 13 and LR changing SL selection switch 14 are placed in the on state for a predetermined period, and HR changing BL selection switch 16 and HR changing SL selection switch 18 are placed in the off state, thereby causing current LRIcell to flow through memory cell 3 in a direction from source line SL to bit line BL.

This evaluation circuit can evaluate memory cell 3 for each bit by applying a predetermined voltage to the terminals of source line drive circuit 22a and bit line drive circuit 22b, yet when a memory cell array is formed and evaluated, the evaluation circuit is configured such that source line drive circuit 22a and bit line drive circuit 22b are shared by memory cells 3. In the evaluation, memory cells are selectively evaluated, and rewrite evaluation is possible for each bit or for each memory cell array with a plurality of bits.

LR changing BL selection switch 13, LR changing SL selection switch 14, HR changing BL selection switch 16, and HR changing SL selection switch 18 are typical selection circuits that are transistors, and the size and the configuration of the transistors and the gate voltages thereof are determined so as to reduce voltage drops as much as possible and so as not to limit currents at the spots.

For both the high-resistance changing operation and the low-resistance changing operation, voltage VdL is steadily applied to LR changing power supply terminal 11, voltage Vclamp (<VdL) is steadily applied to LR changing clamp control terminal 12, and voltage VdH is steadily applied to HR changing power supply terminal 17.

In the high-resistance changing operation, voltage VwH is applied to memory cell gate terminal MG of memory cell transistor 1, and HR changing BL selection switch 16 and HR changing SL selection switch 18 are placed in the on state for a period of 100 ns. At this time, LR changing BL selection switch 13 and LR changing SL selection switch 14 are placed in the off state. By performing such a high-resistance changing operation, current HRIcell is caused to flow through variable resistance nonvolatile storage element RSE from bit line BL to source line SL, thus changing the resistance to a high resistance.

In the low-resistance changing operation, in 1T1R memory cell 3 that includes variable resistance nonvolatile storage element RSE and memory cell transistor 1, voltage VwL is applied to memory cell gate terminal MG of memory cell transistor 1, and LR changing BL selection switch 13 and LR changing SL selection switch 14 are placed in the on state for a period of 100 ns. At this time, HR changing BL selection switch 16 and HR changing SL selection switch 18 are placed in the off state. By performing such a low-resistance changing operation, current LRIcell is caused to flow through variable resistance nonvolatile storage element RSE from source line SL to bit line BL, thus changing the resistance to a low resistance. At this time, a constant current source that is PMOS transistor 10 can limit a current to constant current Iset, and a gate voltage is applied to memory cell transistor 1 in order that memory cell transistor 1 operates with sufficiently low impedance. Accordingly, current Imos flowing through memory cell transistor 1 and current LRIcell flowing through variable resistance nonvolatile storage element RSE are limited to Iset.

Next, a rewrite operation for evaluation performed in the experiment is to be described.

Figure 4:
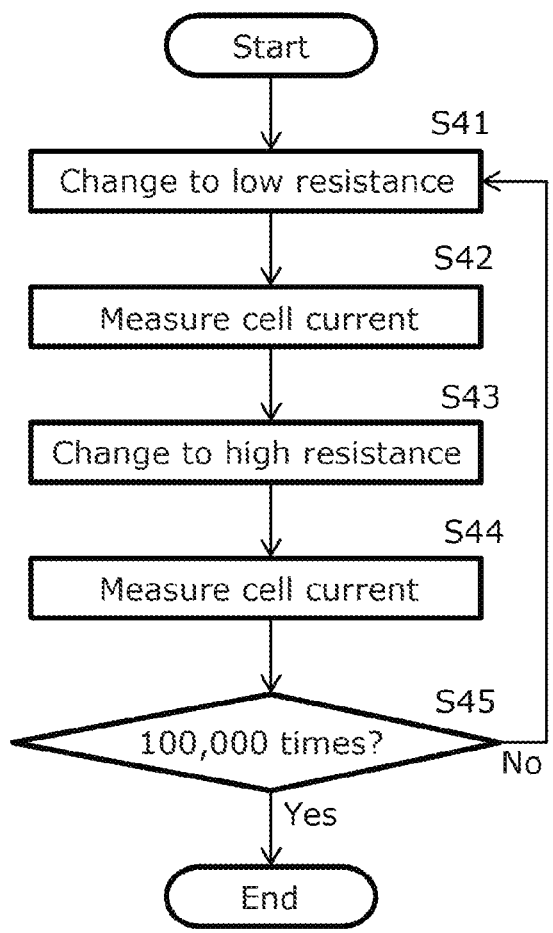
FIG. 4 illustrates a processing flow for an experiment, which includes rewrite processing performed multiple times.

FIG. 4 illustrates a processing flow for an experiment, which includes rewrite processing performed multiple times. The processing flow in the drawing is performed for each of the variable resistance nonvolatile storage device according to the comparative example in FIG. 13 and the variable resistance nonvolatile storage device 2 in FIG. 2A.

In FIG. 4, first, a low-resistance changing operation and cell current measurement are performed on evaluation target bits (for example, about 1 kb) in the memory cell array (S41 and S42). Subsequently, a high-resistance changing operation and cell current measurement are performed on the evaluation target bits (S43 and S44). Such resistance changing operations are repeated for 100,000 times (S45). Cell current measurement is for checking whether memory cell 3 is placed in a desired resistance state by the resistance changing operations, and for measuring a current value with the application of a low voltage that does not disturb variable resistance nonvolatile storage element RSE. FIG. 14 illustrates drive conditions for the variable resistance nonvolatile storage device according to the embodiment. The drive conditions are applied to the variable resistance nonvolatile storage device according to the comparative example in FIG. 13 and variable resistance nonvolatile storage device 2 in FIG. 2A.

For both the low-resistance changing operation and the high-resistance changing operation, 2.8 V is steadily given to voltage VdL at LR changing power supply terminal 11, an intermediate voltage of 1.73 V is steadily given to voltage Vclamp at LR clamp control terminal 12, and 1.7 V is steadily given to voltage VdH at HR changing power supply terminal 17. Here, 1.73 V is given to voltage Vclamp to acquire a constant current source of 175 μA, yet a current value set for the constant current source can be changed by changing voltage Vclamp.

For example, when a constant current source of 75 μA is to be acquired in FIG. 13, 1.86 V may be given to voltage Vclamp. Then, in the low-resistance changing operation, voltage VwL of 3.0 V is applied to memory cell gate terminal MG of memory cell transistor 1, and LR changing BL selection switch 13 and LR changing SL selection switch 14 are placed in the on state for a period of 100 ns. HR changing BL selection switch 16 and HR changing SL selection switch 18 are placed in the off state.

In the high-resistance changing operation, voltage VwH of 1.8 V is applied to memory cell gate terminal MG of memory cell transistor 1, and HR changing BL selection switch 16 and HR changing SL selection switch 18 are placed in the on state for a period of 100 ns. LR changing BL selection switch 13 and LR changing SL selection switch 14 are placed in the off state.

In the low-resistance changing operation in FIG. 2A, Vc1 and Vc2 applied are both 1.73 V. The lengths of the PMOS transistors of LR changing current limiting elements 26 and 27 are the same, and the ratio of the widths of the transistors of LR changing current limiting elements 26 and 27 are set to 4:3. As a result, LR changing current limiting element 26 generates a first constant current having a value of 100 µA, and LR changing current limiting element 27 generates a second constant current having a value of 75 µA.

Next, evaluation results are to be described.

First, measurement data that indicates some of resistance changes for 100,000 times is used to described its tendency.

Figure 5:
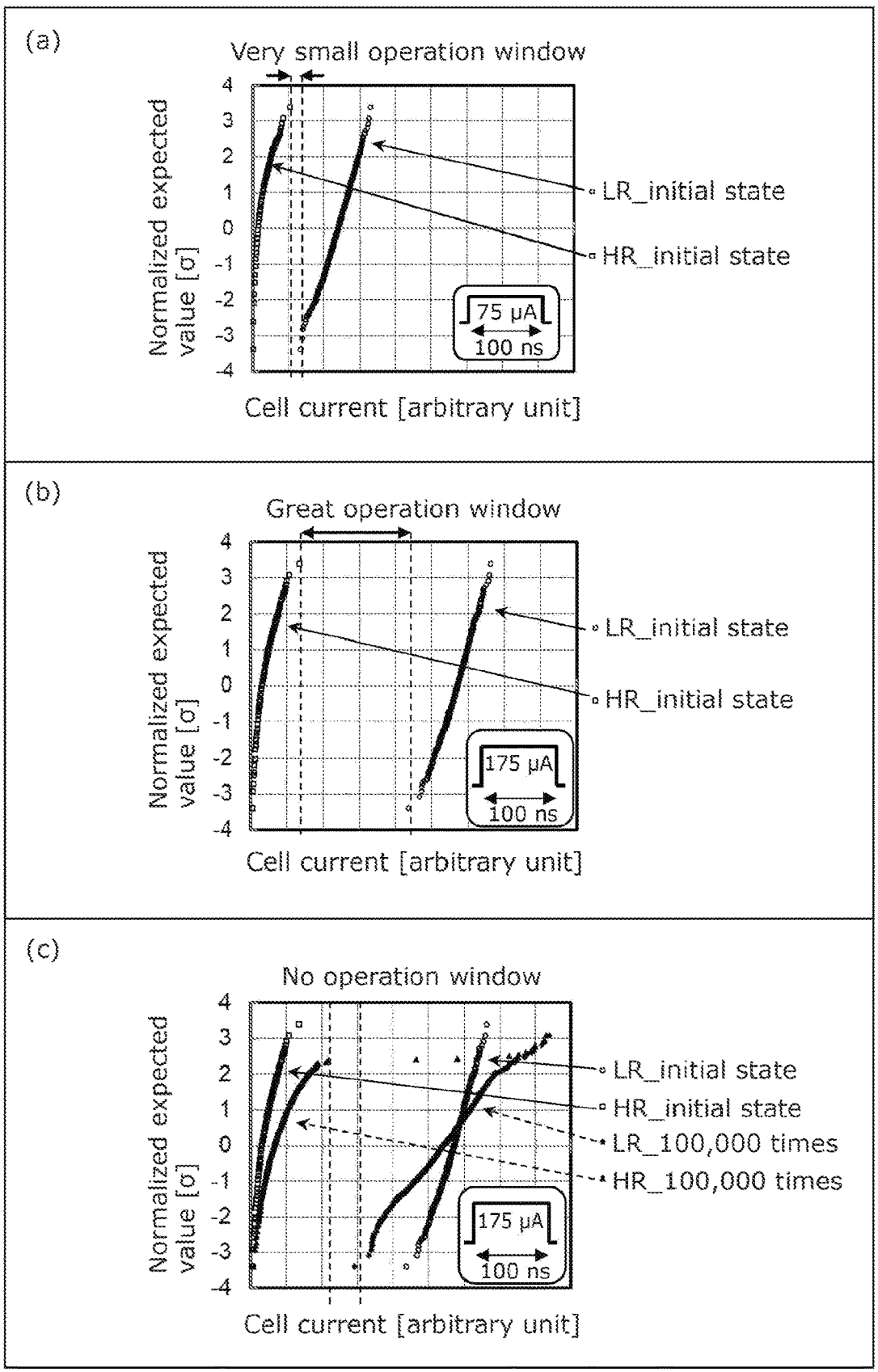
FIG. 5 illustrates plot diagrams showing normalized expected values indicating distributions of currents flowing through a 1T1R memory cell, as results of experiments in a comparative example.

FIG. 5 illustrates plot diagrams showing normalized expected values indicating distributions of currents flowing through a 1T1R memory cell according to the comparative example in FIG. 13, as the results of experiments.

Part (a) of FIG. 5 illustrates distributions of cell currents (about 1 kb) obtained by plotting normalized expected values in the high resistance state (HR) and the low resistance state (LR) in an initial state in which operation is stably performed after forming when the current value of a constant current source is set to 75 µA. White hollow squares show cell currents in the high resistance state, whereas white circles show cell currents in the low resistance state.

Part (b) of FIG. 5 illustrates distributions of cell currents (about 1 kb) obtained by plotting normalized expected values in the high resistance state (HR) and the low resistance state (LR) in an initial state in which operation is stably performed after forming when the current value of a constant current source is set to 175 µA. White hollow squares show cell currents in the high resistance state, whereas white circles show cell currents in the low resistance state.

Part (c) of FIG. 5 illustrates transitions of distributions of cell currents (about 1 kb) obtained by plotting normalized expected values in the high resistance state (HR) and the low resistance state (LR), in an initial state in which operation is stably performed after forming when the current value of a constant current source is set to 175 µA, and after rewrite is performed 100,000 times. White hollow squares show cell currents in the high resistance state, whereas white circles show cell currents in the low resistance state. Further, black rhomboids show the low resistance state after rewrite is performed 100,000 times, whereas black triangles show cell currents in the high resistance state after rewrite is performed 100,000 times.

Using a sense amplifier circuit, a storage device in which a variable resistance nonvolatile storage element is used reads out the low resistance state or the high resistance state that is written, and performs an operation to determine whether data indicates "1" or "0". In order to do so, the smallest cell current value in the low resistance state and the greatest cell current value in the high resistance state need to have at least a predetermined difference (operation window).

As illustrated in (a) of FIG. 5, when the LR write current is set to a low current of 75 µA, an LR cell current decreases, and the operation window becomes less than the predetermined difference and very small. Thus, it is difficult to stably determine data in the sense amplifier circuit.

In (b) of FIG. 5, the LR write current is increased to 175 µA, to increase an LR cell current. As a result, the operation window can be ensured.

However, as illustrated in (c) of FIG. 5, if the number of times rewrite is performed is increased to 100,000, deterioration (an increase in variations of cell current distributions) in resistance changing operation due to rewrite becomes noticeable, and a high resistance failure bit and a current decreased bit at an end of an LR cell current distribution are generated. Consequently, there is substantially no operation window.

Figure 6:
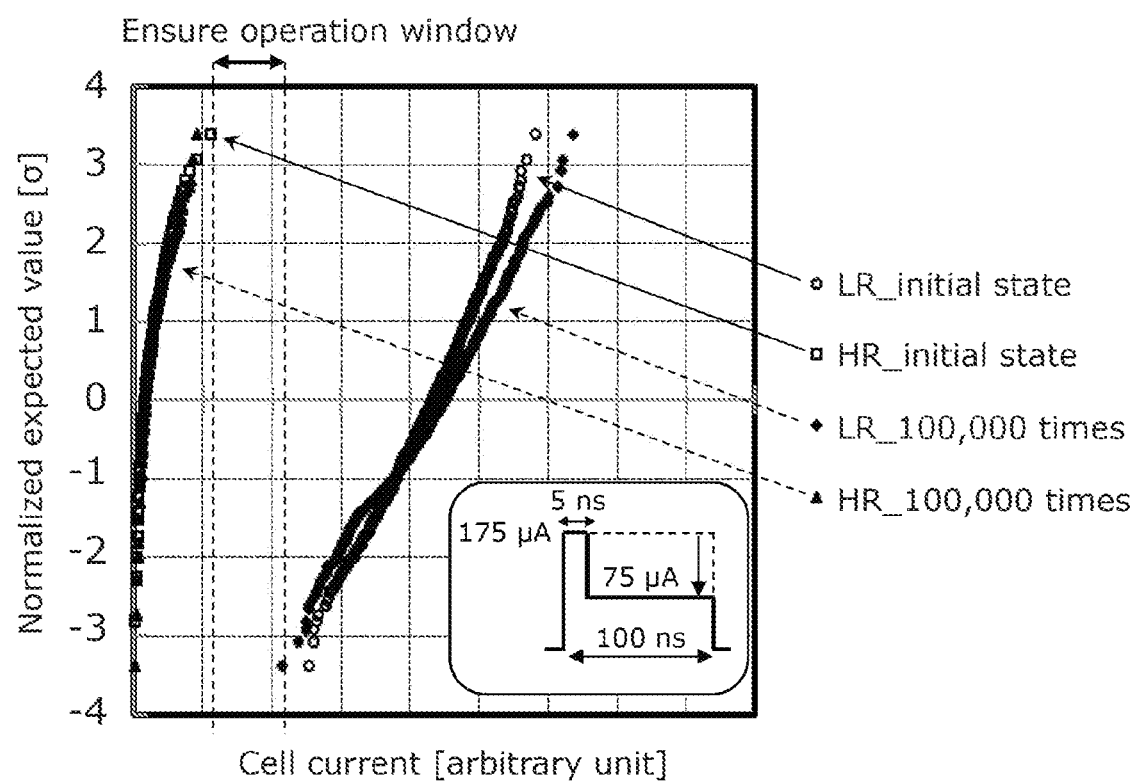
FIG. 6 is a pilot diagram of normalized expected values showing distributions of currents flowing through a 1T1R memory cell in FIG. 2A in the embodiment.

FIG. 6 is a pilot diagram of normalized expected values showing distributions of currents flowing through the 1T1R memory cell in FIG. 2A in the embodiment of the present disclosure. The drawing shows transitions of distributions of cell currents (about 1 kb) obtained by plotting normalized expected values in the high resistance state (HR) and the low resistance state (LR) in an initial state in which the set current value of a constant current source is decreased from 175 µA in total (current application time 5 ns) to 75 µA (current application time 95 ns) and LR write is performed, and after rewrite is performed 100,000 times. White hollow squares show cell currents in the high resistance state in the initial state, whereas white circles show cell currents in the low resistance state in the initial state. Further, black rhomboids show the low resistance state after rewrite is performed 100,000 times, whereas black triangles show cell currents in the high resistance state after rewrite is performed 100,000 times.

A pulse width is made shorter than a conventional write current pulse (a constant current of 175 µA and a pulse width of 100 ns) due to a high current short pulse (a constant current of 175 µA and a pulse width of 5 ns) in the first period, so that movement of an oxygen ion from the inside of filament 86 to the first Ta oxide layer that is first transition metal oxide layer 82, that is, a reduction reaction is insufficient. Accordingly, although a median value of an LR cell current is decreased, the initial window can be ensured. Filament 86 is annealed by the application of a low current pulse (a constant current of 75 µA and a pulse width of 95 ns) in the subsequent second period, a cavity (defect) formed by the movement of an oxygen ion in filament 86 is made uniform and stable. Deterioration of a resistance changing operation (an increase in variation of cell current distributions) due to an increase in the number of times rewrite is performed can be noticeably decreased, and operation of stably continuing rewrite can be performed.

As described above, by performing constant current two-stage decrease write according to the present disclosure, an initial window can be ensured owing to a high current short pulse, and also deterioration in rewrite can be reduced and rewrite can be stably performed owing to a low current pulse.

3. Example of Configuration that Includes Memory Array of Variable Resistance Nonvolatile Storage Device Next, as an embodiment of the present disclosure, an entire configuration of a variable resistance nonvolatile storage device that includes a matrix of 1T1R memory cells, in which variable resistance elements RSE described above and constant current two-stage decrease driving in the present disclosure are used, is to be described.

Embodiment 1

Figure 7:
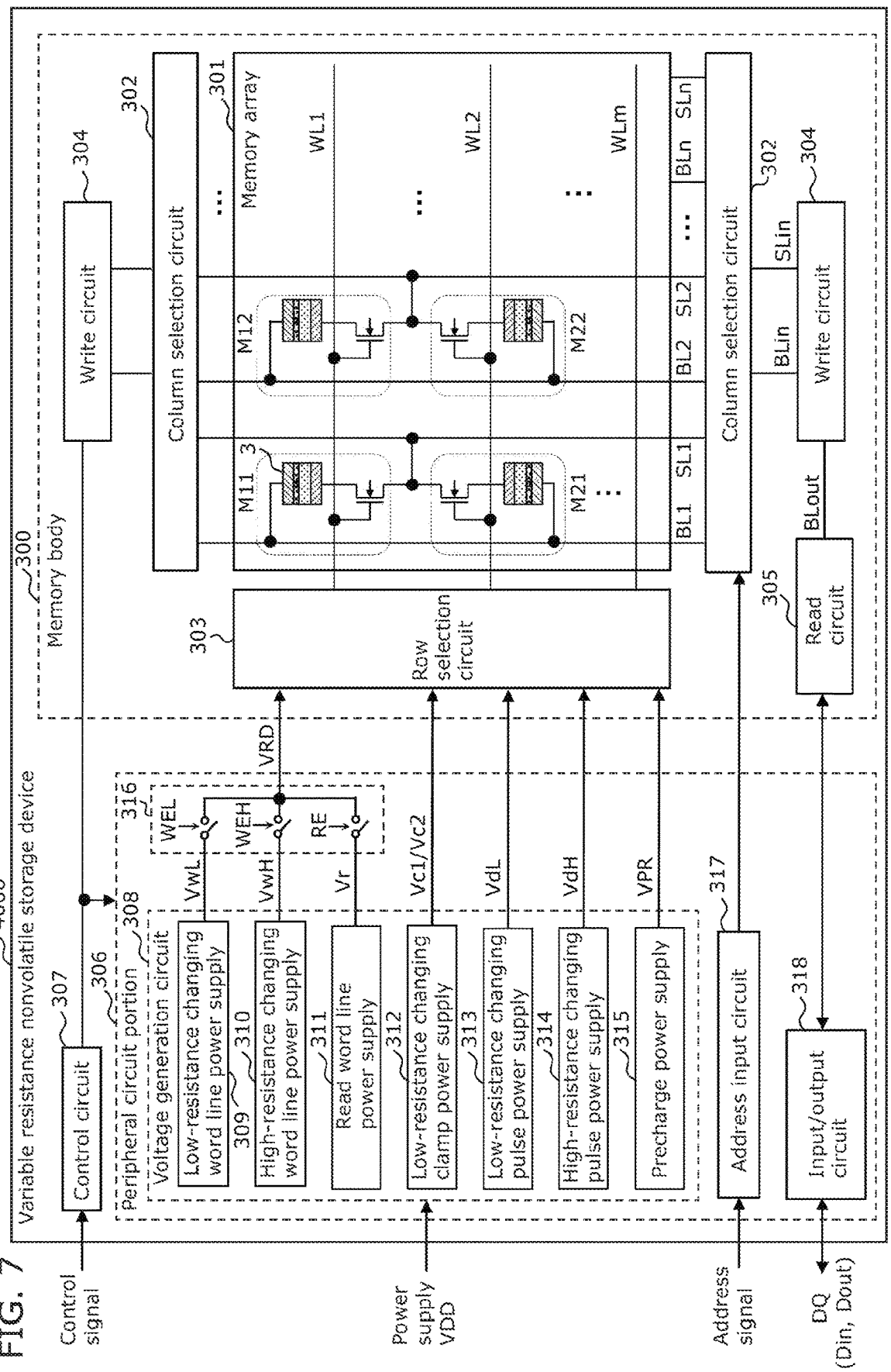
FIG. 7 is a block diagram illustrating an example of a configuration of the variable resistance nonvolatile storage device in the embodiment.

FIG. 7 is a block diagram illustrating an example of a configuration of a variable resistance nonvolatile storage device in the embodiment of the present disclosure.

Variable resistance nonvolatile storage device 4000 according to the present embodiment includes memory body 300 above a semiconductor substrate. Memory body 300 includes memory array 301, column selection circuits 302, row selection circuit 303, write circuits 304 for writing data, and read circuit 305 that detects an amount of a current that flows through a selected bit line and determines whether stored data is "1" or "0".

Peripheral circuit portion 306 includes voltage generation circuit 308, word line voltage switch circuit 316, address input circuit 317, and input/output circuit 318. Control circuit 307 is provided which controls operation of memory body 300 and peripheral circuit portion 306, based on control signals input from the outside.

Voltage generation circuit 308 includes low-resistance changing word line power supply 309, high-resistance changing word line power supply 310, read word line power supply 311, low-resistance changing clamp power supply 312, low-resistance changing pulse power supply 313, high-resistance changing pulse power supply 314, and precharge power supply 315.

These power supplies receive input of external power supply VDD, and generate voltages having predetermined set voltage values illustrated in FIG. 14. The values shown here are based on values of voltages in constant current two-stage decrease driving in changing the resistance to a low resistance described in FIG. 1A.

Furthermore, output VwL from low-resistance changing word line power supply 309, output VwH from high-resistance changing word line power supply 310, and output Vr from read word line power supply 311 are supplied to word line voltage switch circuit 316. One of output VwL, output VwH, or output Vr is selected and supplied as output VRD of word line voltage switch circuit 316 to row selection circuit 303, where output VwL is selected by low resistance write instruction signal WEL, output VwH is selected by high resistance write instruction signal WEH, and output Vr is selected by read instruction signal RE.

Outputs Vc1 and Vc2 of low-resistance changing clamp power supply 312, output VdL of low-resistance changing pulse power supply 313, and output VdH of high-resistance changing pulse power supply 314 are supplied to write circuits 304. Output VPR of precharge power supply 315 is supplied to column selection circuits 302 and write circuits 304. The power supplies include general voltage step-down circuits that each generate a predetermined voltage by decreasing a voltage of external power source VDD, and thus detailed description is omitted. The power supply circuits are influenced by, for instance, manufacturing variations and are set to optimal operating points, and thus is provided with a trimming function generally used, in order to finely adjust their output voltages.

Note that depending on a voltage value of external power supply VDD, any or all of the power supply circuits may be configured to generate a voltage by increasing a voltage from external power supply VDD.

Further, any of or all of the power supply circuits are not necessarily included in variable resistance nonvolatile storage device 4000, and may be configured to provide a predetermined voltage as an external power supply.

Address input circuit 317 receives an address signal input from the outside, and indicates designated memory cell 3 in memory array 301.

Input/output circuit 318 receives data input signal Din input from the outside through DQ terminal and supplies the signal as a write signal to memory body 300. Alternatively, input/output circuit 318 receives a read output signal from memory body 300 and outputs output signal Dout through DQ terminal.

Memory array 301 includes a matrix in which m rows and n columns of memory cells 3 described above as basic data of the present disclosure are disposed. Here, the upper left memory cell is denoted by M11, and memory cells in the rows are denoted by M11, M21, ..., and Mm1, whereas memory cells in the columns are denoted by M11, M12, ..., and M1n.

Word lines WL1, WL2, ..., and WLm that extend from row selection circuit 303 in the row direction are connected to memory cell gate terminals MG of memory cells 3.

Bit lines BL1, BL2, ..., and BLn and source lines SL1, SL2, ..., and SLn that extend from column selection circuits 302 in the column direction are parallel to one another, and are connected to bit lines BL and source lines SL of memory cells 3.

Column selection circuits 302 and write circuits 304 are disposed on the upper side and the lower side of memory array 301, and are configured to control writing from both ends of bit lines BL1, BL2, ..., and BLn and source lines SL1, SL2, ..., and SLn.

These circuits are disposed on both sides in order to reduce the influence of an IR drop due to line resistance of bit lines and source lines, but may be disposed only on, for example, the lower side if the influence of an IR drop is small depending on the number of memory cells 3 disposed and line resistance in the manufacturing process applied.

By operation of writing to memory cell 3, similarly to the described case of basic data of the present disclosure, the state of memory cell 3 is changed to the low resistance state when bit line BL is set to a low potential and source line SL is set to a high potential, and the state of memory cell 3 is changed to a high resistance when bit line BL is set to a high potential and source line SL is set to a low potential.

Figure 8:
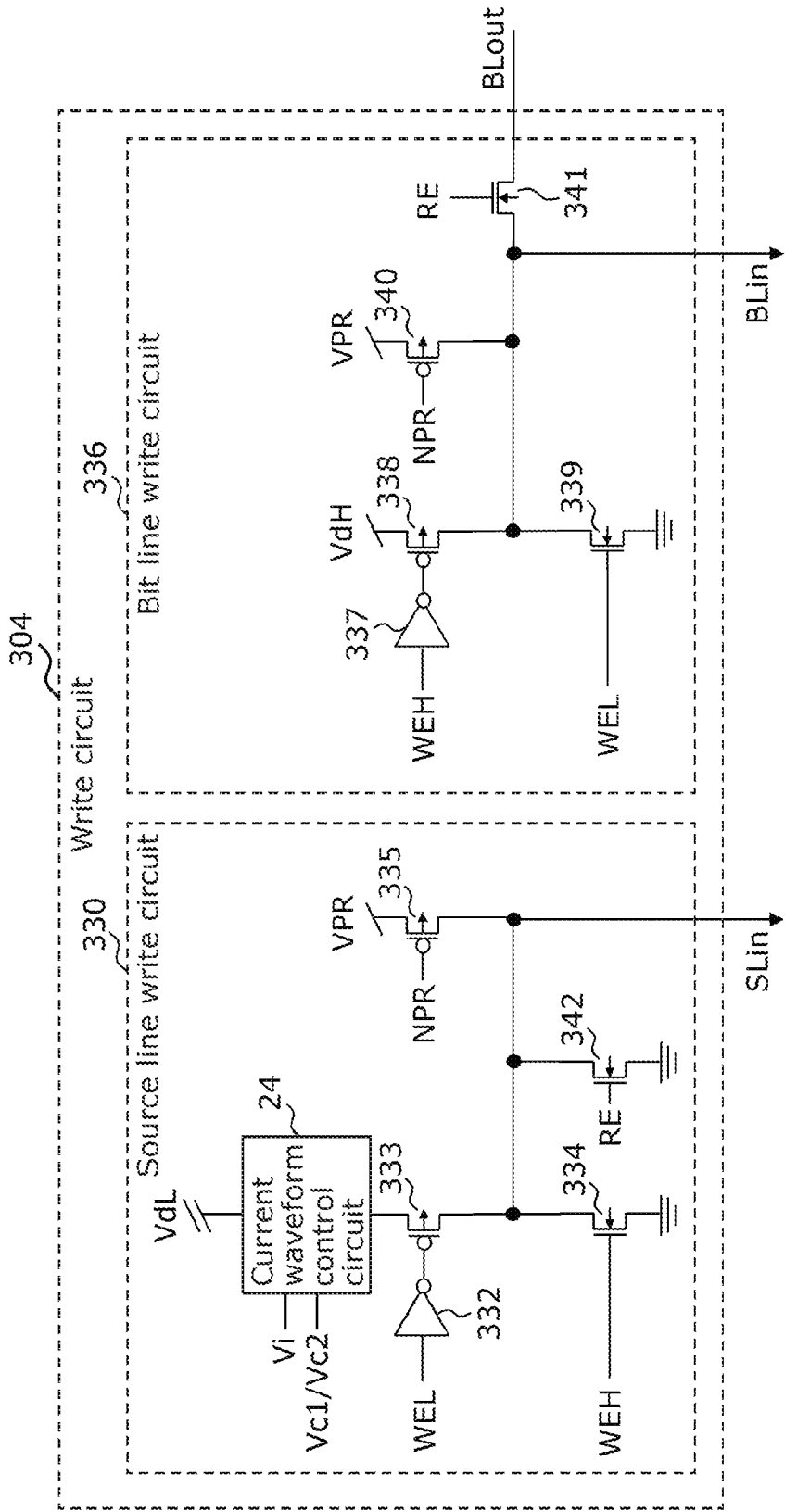
FIG. 8 illustrates an example of a write circuit in the variable resistance nonvolatile storage device in the embodiment.

FIG. 8 illustrates an example of write circuit 304.

Write circuit 304 includes source line write circuit 330 and bit line write circuit 336.

Source line write circuit 330 is connected to source line input terminal SLin via (i) current waveform control circuit 24 in which output VdL of low-resistance changing pulse power supply 313 is input to LR changing power supply terminal 11, outputs Vc1 and Vc2 of low-resistance changing clamp power supply 312 are input to the gate terminals of LR changing current limiting elements 26 and 27, and low-resistance changing voltage pulse Vi output from control circuit 307 is input to write pulse width control terminal 33, and (ii) PMOS transistor 333 that is connected in series to a common drain terminal of constant current control switches 31 and 32 disposed in current waveform control circuit 24 and that has a gate through which an output of inverter 332 that receives an input that is low resistance write instruction signal WEL is input. Furthermore, source line input terminal SLin is connected to NMOS transistor 334 having a gate through which a high resistance write instruction signal WEH is input and a source connected to the ground, PMOS transistor 335 that has a source through which output VPR of precharge power supply 315 is input and a gate through which precharge instruction signal NPR is input, and NMOS transistor 342 that has a gate through which read instruction signal RE is input and a source connected to the ground.

Bit line write circuit 336 includes: PMOS transistor 338 that has a source through which output VdH of high-resistance changing pulse power supply 314 is input, a gate through which an output of inverter 337 that receives an input of high resistance write instruction signal WEH, and a drain connected to bit line input terminal BLin; NMOS transistor 339 that has a drain connected to bit line input terminal BLin, a gate through which low resistance write instruction signal WEL is input, and a source connected to the ground; PMOS transistor 340 that has a gate through which precharge instruction signal NPR is input, a source through which output VPR of precharge power supply 315 is input, and a drain connected to bit line input terminal BLin; and NMOS transistor 341 that has a gate through which read instruction signal RE is input, a drain connected to bit line input terminal BLin, and a source connected to bit line output signal BLout.

Bit line output signal BLout is connected to read circuit 305.

Note that LR changing SL selection switch 14 in the variable resistance nonvolatile storage device in FIG. 1A corresponds to PMOS transistor 333, LR changing BL selection switch 13 therein corresponds to NMOS transistor 339, HR changing BL selection switch 16 therein corresponds to PMOS transistor 338, and HR changing SL selection switch 18 therein corresponds to NMOS transistor 334.

Figure 9:
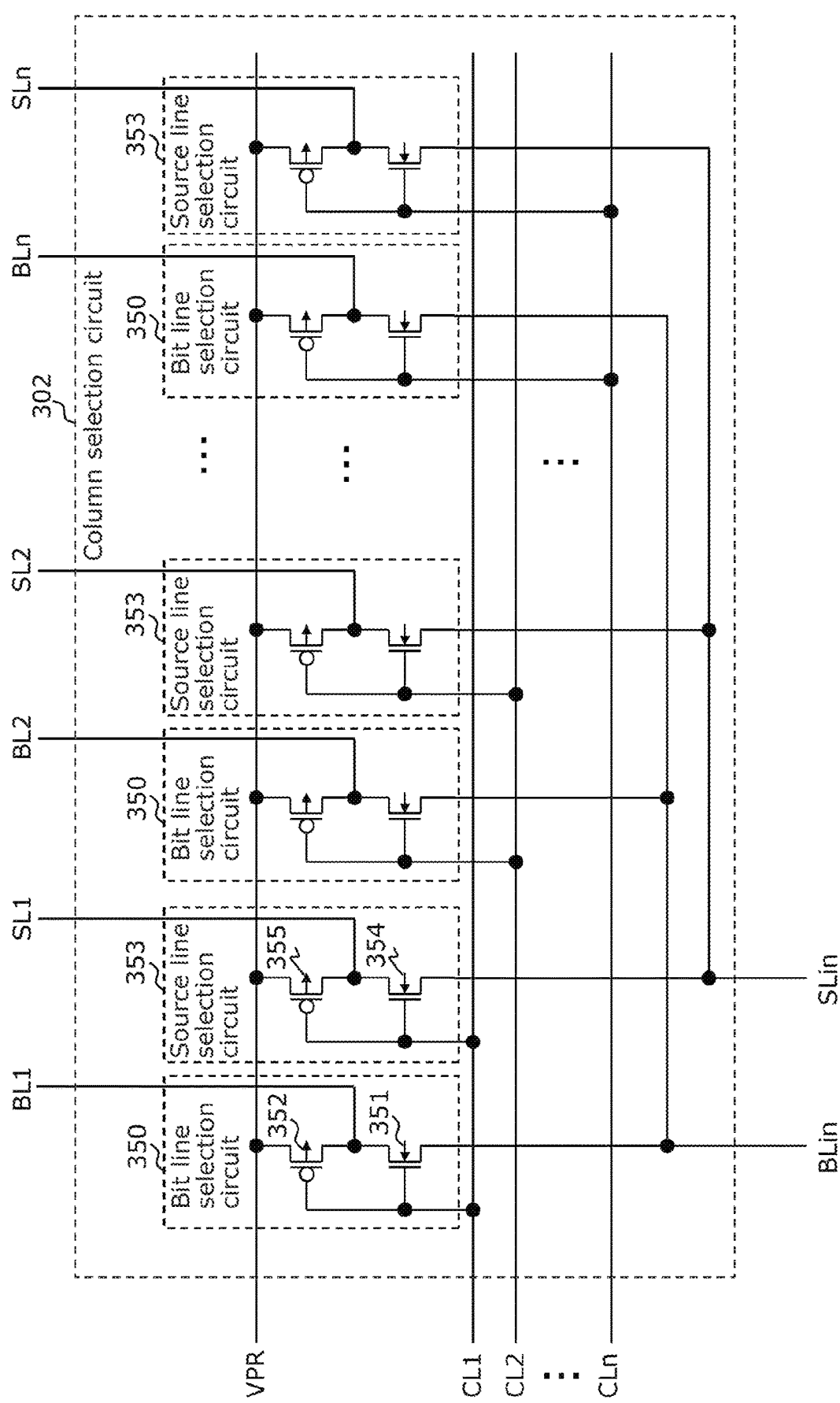
FIG. 9 illustrates an example of a column selection circuit in the variable resistance nonvolatile storage device in the embodiment.

FIG. 9 illustrates an example of column selection circuit 302.

Bit line selection circuit 350 includes NMOS transistor 351 that has a source and a drain one of which is connected to bit line BLi (i=1 to n) and the other of which is connected to bit line input terminal BLin, and PMOS transistor 352 that has a source and a drain one of which is similarly connected to bit line BLi (i=1 to n) and the other of which is connected to output VPR of precharge power supply 315. The gates of the transistors are connected to identical column selection signal line CLi (i=1 to n).

Source line selection circuit 353 includes NMOS transistor 354 that has a source and a drain one of which is connected to source line SLi (i=1 to n) that is paired with bit line BLi and the other of which is connected to source line input terminal SLin, and PMOS transistor 355 that has a source and a drain one of which is similarly connected to source line SLi (i=1 to n) and the other of which is connected to output VPR of precharge power supply 315. The gates of the transistors are connected to identical column selection signal line CLi (i=1 to n).

Bit line selection circuits 350 and source line selection circuits 353 are alternately arranged.

Out of n column selection signal lines CLi (i=1 to n), only a selected line is set to a high level, and the remaining lines are set to a low level. Only a selected pair of bit line BLi and source line SLi are connected to bit line input terminal BLin and source line input terminal SLin, and remaining bit lines BLi and source lines SLi that are not selected are precharged to VPR.

The high level of column selection signal line CLi (i=1 to n) is external power supply VDD, yet a higher voltage may be applied only to an output of the signal line or the signal line may be paired with a PMOS transistor, in order to prevent the influence of the threshold voltages of NMOS transistor 351 and NMOS transistor 354.

Figure 10:
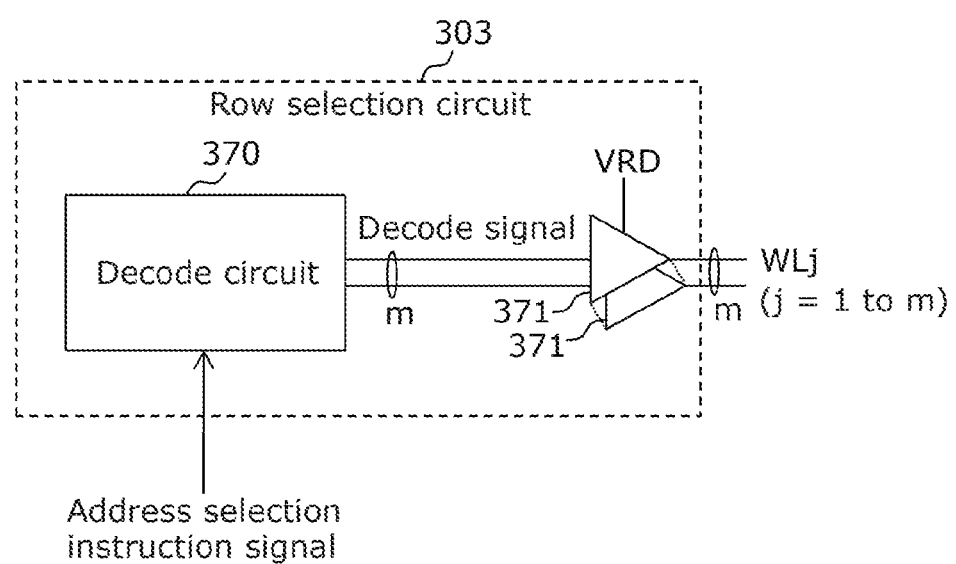
FIG. 10 illustrates a row selection circuit in the variable resistance nonvolatile storage device in the embodiment.

FIG. 10 illustrates an example of row selection circuit 303.

Row selection circuit 303 includes decode circuit 370 that generates a decode signal that designates a selected row, based on an address selection instruction signal generated by address input circuit 317, and word line driver 371 connected to the decode signal. Word line driver 371 receives output VRD of word line voltage switch circuit 316 as another input. The number of word line drivers 371 corresponds to the number of word lines (m word lines). Voltage VwL is applied to word line WLj (j=1 to m) for a selected row when low resistance writing is performed, voltage VwH is applied thereto when high resistance writing is performed, and voltage Vr is output for a designated period when a read operation is performed.

Operation of variable resistance nonvolatile storage device 4000 having a configuration as above is to be described with reference to the timing chart illustrated in FIG. 11.

Note that here, it is defined that the case where a variable resistance nonvolatile storage element is in the high resistance state is assigned to data "0", and the case where a variable resistance nonvolatile storage element in the low resistance state is assigned to data "1". With regard to amplitude levels of a control signal, when no voltage symbol is given, a high level is external power supply VDD, whereas a low level is 0 V.

Examples of operation are described for four cycles, namely, cycle T1 for low resistance wiring into memory cell M11, cycle T2 for high resistance writing into memory cell M12, cycle T3 for reading from memory cell M11 in the low resistance state, and cycle T4 for reading from memory cell M12 in the high resistance state.

First, operation of low resistance writing into memory cell M11 during cycle T1 is to be described.

At the beginning, all of word lines WLj (j=1 to m) and column selection signal lines CLi (i=1 to n) are 0 V, and all the memory cells are in an unselected state.

On the other hand, precharge instruction signal NPR is a negative logic signal, and gives a precharge instruction at 0 V. As a result, all of bit lines BLi, source lines SLi (i=1 to n), bit line input terminal BLin and source line input terminal SLin are precharged to voltage VPR.

The input/output DQ terminal is set to a high level to write data "1".

Next, precharge instruction signal NPR is set to a high level, and the precharged state of bit line input terminal BLin and source line input terminal SLin is cancelled.

Next, in response to a selection instruction from address input circuit 317, WL1 that is a selected word line and column selection signal line CL1 that is a selected column are set to a high level. At this time, the voltage at word line WL1 is VwL. The precharged state of bit line BL1 and source line SL1 that are selected columns is cancelled, and are connected to bit line input terminal BLin and source line input terminal SLin. On the other hand, the other unselected bit lines and the other unselected source lines are maintained in the precharged state.

Next, in response to an instruction to write data "1" given through the input/output DQ terminal, low resistance write instruction signal WEL is set to the high level for a period of 100 ns, and negative logic voltage pulse Vi is set to the low level for a period of 100 ns. In response thereto, source line input terminal SLin is driven on the high potential side, and bit line input terminal BLin is driven on the low potential side. Thus, constant current two-stage decrease low resistance write operation described in detail as basic data of the present disclosure is performed on selected memory cell M11.

Next, in response to the end of the low resistance write instruction, selected word line WL1 and selected column selection signal line CL1 are set to 0 V. Consequently, memory cell M11 is placed in the unselected state and furthermore, precharging bit line BL1 and source line SL1 starts.

Finally, precharge instruction signal NPR is set to 0 V, precharging bit line terminal BLin and source line input terminal SLin starts, and the low resistance write cycle ends.

Next, operation of high resistance writing into memory cell M12 during cycle T2 is to be described.

At the beginning, all of word lines WLj (j=1 to m) and column selection signal lines CLi (i=1 to n) are 0 V, and all the memory cells are in an unselected state.

On the other hand, a precharge instruction is given using precharge instruction signal NPR having 0 V, and bit lines BLi, source lines SLi (i=1 to n), bit line input terminal BLin, and source line input terminal SLin are precharged to voltage VPR.

The input/output DQ terminal is set to the low level to write data "0".

Next, precharge instruction signal NPR is set to the high level, and the precharged state of bit line input terminal BLin and source line input terminal SLin is cancelled.

Next, in response to a selection instruction from address input circuit 317, WL1 that is a selected word line and column selection signal line CL2 that is a selected column are set to the high level. At this time, the voltage at word line WL1 is VwH for high resistance writing. The precharged state of bit line BL2 and source line SL2 that are selected columns is cancelled, and are connected to bit line input terminal BLin and source line input terminal SLin. On the other hand, the other unselected bit lines and the other unselected source lines are maintained in the precharged state.

Next, in response to an instruction to write data "0" which is given through the input/output DQ terminal, high resistance write instruction signal WEH is set to the high level for a period of 100 ns. In response thereto, source line input terminal SLin is driven on the low potential side, and bit line input terminal BLin is driven on the high potential side. Thus, high resistance write operation described in detail as basic data of the present disclosure is performed on selected memory cell M12.

Note that a cell current in this timing chart indicates its absolute value, and the direction of the flow is opposite to the direction in cycle T1.

Next, in response to the end of the high resistance write instruction, selected word line WL1 and selected column selection signal line CL2 are set to 0 V. Consequently, memory cell M12 is placed in the unselected state and furthermore, precharging bit line BL2 and source line SL2 starts.

Finally, precharge instruction signal NPR is set to 0 V, precharging bit line terminal BLin and source line input terminal SLin starts, and the high resistance write cycle ends.

Next, operation of reading the low resistance state of memory cell M11 in cycle T3 is to be described.

At the beginning, all of word lines WLj (j=1 to m) and column selection signal lines CLi (i=1 to n) are set to 0 V, and all the memory cells are in the unselected state.

On the other hand, a precharge instruction is given using precharge instruction signal NPR having 0 V, and all of bit lines BLi, source lines SLi (i=1 to n), bit line input terminal BLin, and source line input terminal SLin are precharged to voltage VPR Next, precharge instruction signal NPR is set to the high level, and the precharged state of bit line input terminal BLin and source line input terminal SLin is cancelled.

Next, in response to a selection instruction from address input circuit 317, WL1 that is a selected word line and column selection signal line CL1 that is a selected column are set to the high level. At this time, a voltage at word line WL1 is Vr for reading. The precharged state of bit line BL1 and source line SL1 that are selected columns is cancelled, and bit line BL1 and source line SL1 are connected to bit line input terminal BLin and source line input terminal SLin. On the other hand, the other unselected bit lines and the other unselected source lines are maintained in the precharged state.

Next, read instruction signal RE is set to the high level for a period for a read operation (set to 150 ns, here), NMOS transistor 342 is turned on, selected source line SL1 is driven on the low potential side via source line input terminal SLin and furthermore, NMOS transistor 341 is turned on, and selected bit line BL1 is connected to bit line output signal BLout via bit line input terminal BLin. Bit line output signal BLout is connected to read circuit 305, and data "1" and data "0" are distinguished according to the amount of current flowing from the bit line BL side to the source line SL side. The low resistance state is written in memory cell M11, and a greater amount of current flows through memory cell M11 than in the high resistance state. Thus, read circuit 305 determines that stored data is data "1", and outputs a high-level signal through the input/output DQ terminal.

Next, in response to the end of the read instruction, selected word line WL1 and selected column selection signal line CL1 are set to 0 V. Consequently, memory cell M11 is placed in the unselected state and furthermore, precharging bit line BL1 and source line SL1 starts.

Finally, precharge instruction signal NPR is set to 0 V, precharging bit line terminal BLin and source line input terminal SLin starts, and the read operation cycle ends.

An operation of reading the high resistance state of memory cell M12 in cycle T4 is the same as the operation in cycle T3 except that a selected column is different from that in cycle T3, the high resistance state is written in memory cell M12 that is selected, less current flows than the case where the memory cell is in the low resistance state, read circuit 305 determines that stored data is data "0", and a low level is output through the input/output DQ terminal. Thus, a detailed description is omitted.

The above is a description of variable resistance nonvolatile storage device 4000, and advantageous effects of precharging unselected bit lines and unselected source lines to predetermined voltage VPR are to be described with reference to FIG. 12.

Figure 12:
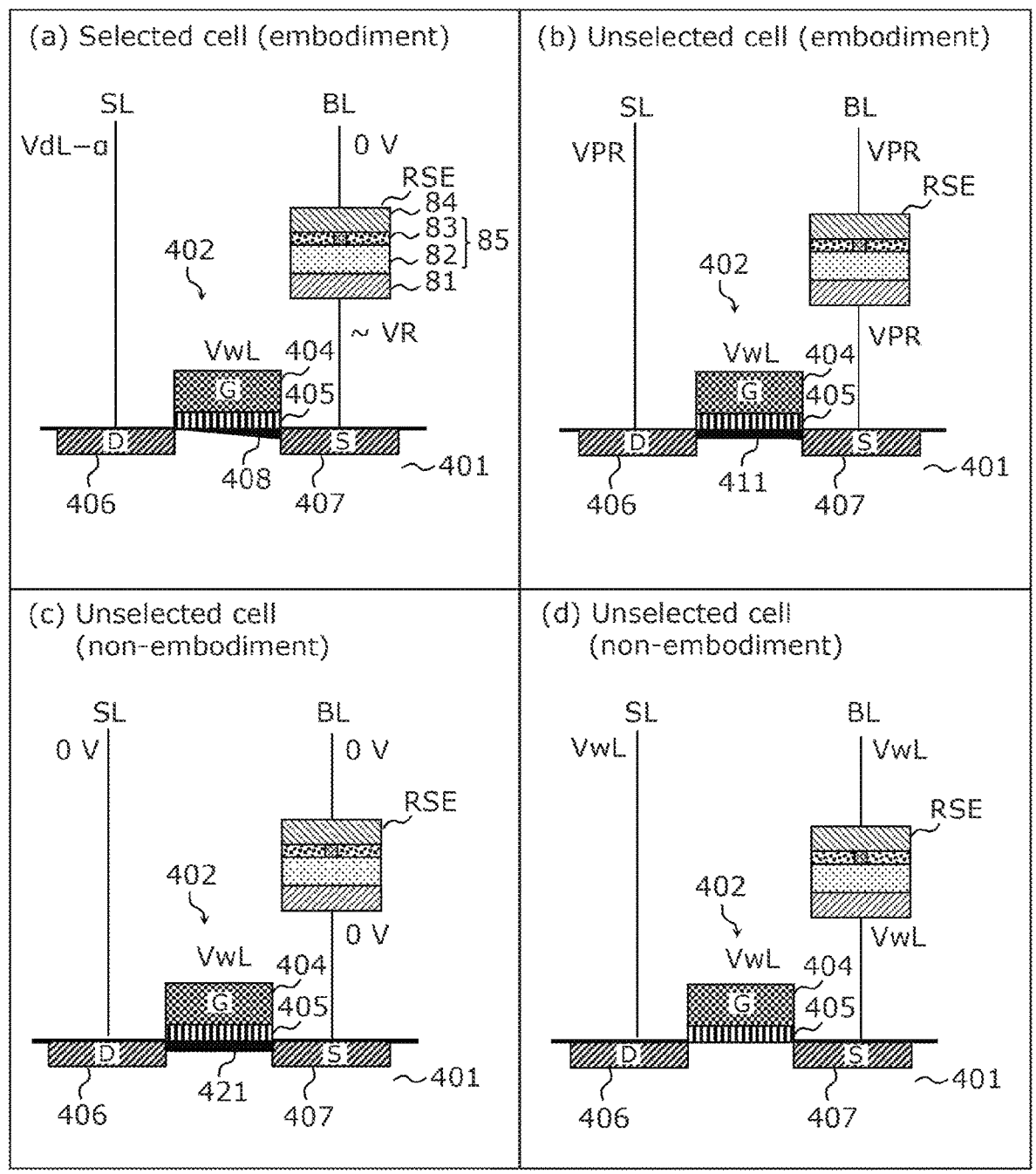
FIG. 12 illustrates biases applied to memory cells in the variable resistance nonvolatile storage device in the embodiment.

FIG. 12 illustrates biases applied to memory cells in the variable resistance nonvolatile storage device in the embodiment.

Figure 11:
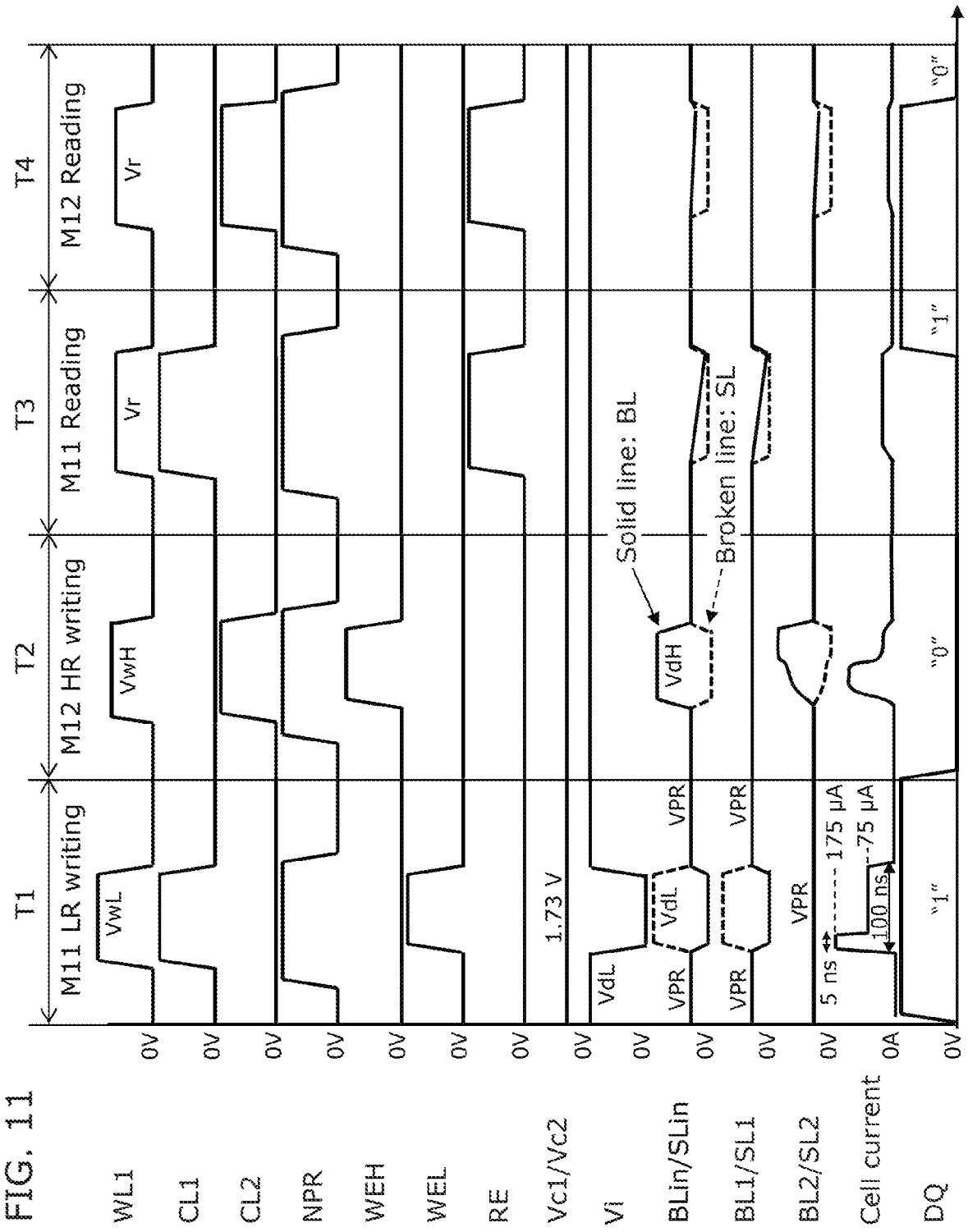
FIG. 11 is a timing chart for the variable resistance nonvolatile storage device in the embodiment.

The state of a memory cell illustrated in (a) of FIG. 12 is an example shown using a schematic cross sectional view of a state of a selected memory cell on which low resistance writing described as the present embodiment is performed, and corresponds to the state of selected memory cell M11 in cycle T1 described in FIG. 11.

Memory cell transistor 402 includes, above semiconductor substrate 401, gate electrode 404 that is a word line, gate oxide film 405, drain 406 that is an N-type diffusion layer connected to source line SL, and source 407 that is an N-type diffusion layer. Source 407 is connected to the lower electrode of variable resistance nonvolatile storage element RSE, and bit line BL is connected to the upper electrode thereof.

In the low resistance writing, source line SL is set to about voltage VdL-α (α denotes a voltage drop caused by LR changing current limiting elements 26 and 27), a bit line is set to a low voltage of 0 V, and voltage VwL is applied to a word line. Memory cell transistor 402 is turned on, channel 408 is formed, and a current flows from drain 406 to source 407.

Normally, if a manufacturing process allows further miniaturization, memory cells are further miniaturized, so that a higher level of integration can be achieved. In this case, the plane size of memory cell transistor 402 is shrunk and furthermore, gate oxide film 405 becomes thinner. Accordingly, a maximum voltage that can be applied to gate electrode 404 decreases as further miniaturization is achieved.

Accordingly, control to reduce an electric field applied to gate oxide film 405 is important for high reliability of a memory cell.

In the present embodiment, in selected memory cell 400, channel 408 is formed, and thus an electric field between gate electrode 404 and channel 408 substantially extends over gate oxide film 405. In the case of low resistance writing, the strongest electric field applied to gate oxide film 405 is channel 408 near source 407 at which voltage is lower. Although bit line BL has 0 V, a current flows through variable resistance nonvolatile storage element RSE, and thus the potential at source 407 increases by a voltage (about 1 to 1.2 V) across terminals of variable resistance nonvolatile storage element RSE. A difference in potential between gate electrode 404 and channel 408 can be substantially reduced to about 1.8 V to 2.0 V.

The state of a memory cell illustrated in (b) of FIG. 12 is an example shown using a schematic cross sectional view of a state of an unselected memory cell in the same row as the selected memory cell on which low resistance writing described as the present embodiment is performed, and corresponds to the state of, for instance, unselected memory cell M12 in cycle T1 described in FIG. 11. Source line SL and bit line BL in an unselected column are precharged to voltage VPR (1.1 V). Since variable resistance nonvolatile storage element RSE is electrically conductive, a voltage at source 407 of an N-type diffusion layer is also VPR together with drain 406 of the N-type diffusion layer. Since the row is selected, gate electrode 404 has voltage VwL, a gate-source potential and a gate-drain potential are both higher than or equal to a threshold voltage of memory cell transistor 402. Memory cell transistor 402 turns on, and channel 411 is formed. The voltage at channel 411 is VPR that is the same as the voltage at bit line BL and source line SL. Accordingly, a potential difference between gate electrode 404 and channel 411 can be reduced to 1.9 V.

On the other hand, the state of a memory cell illustrated in (c) of FIG. 12 is an example of a case in which bit line BL and source line SL of an unselected memory cell in the same row as the selected memory cell on which low resistance writing is performed are precharged to 0 V, which is conventionally and normally conducted. In this case, the voltage at channel 421 is 0 V that is the same as the voltage at bit line BL and source line SL. A difference in potential between gate electrode 404 and channel 421 is 3.0 V, which is higher by at least 1 V than the state of the memory cell in (b) of FIG. 12, and thus is rather undesirable when a process for further miniaturization is applied.

The state of the memory cell in (d) of FIG. 12 is an example of a state when bit line BL and source line SL of an unselected memory cell in the same row as the selected memory cell on which low resistance writing is performed are precharged to the same voltage as voltage VwL at gate electrode 404. In this case, memory cell transistor 402 turns off, and a channel is not formed. Accordingly, an electric field between gate electrode 404 and semiconductor substrate 401 extends over gate oxide film 405. Semiconductor substrate 401 is normally set to 0 V, and thus is substantially the same as 3.0 V in the respect of an electric field over gate oxide film 405 in the memory cell state in (c) of FIG. 12, and thus is rather undesirable in the case where a process for further miniaturization is applied.

As described above, precharge voltage VPR for source line SL and bit line BL of a memory cell in an unselected column is set to have a predetermined voltage relation that VPR is lower than a voltage obtained by subtracting threshold voltage Vtns of memory cell transistor 402 from voltage VwL at a selected word line and is higher than 0 V, in order that a channel is formed. Thus, precharge voltage VPR may be set as shown by the following expression.

$$0V < VPR < VwL - Vtns$$

In this case, precharge voltage VPR is desirably set to a voltage as high as possible and lower than VwL−Vtns, from the aspect of reducing the electric field over gate oxide film 405. Yet, this leads to an opposing problem that power consumption increases by precharging all the unselected bit lines and the unselected source lines to a predetermined voltage.

Considering the balance therebetween, the predetermined voltage may be set to optimal precharge voltage VPR, such as VPR=(VwL−Vtns)/2, for example.

In the present embodiment, a low resistance write current is subjected to constant current two-stage reduction, and thus current waveform control circuit 24 is provided on the LR changing power supply terminal 11 side, yet it is needless to say that a current waveform control circuit having equivalent functions may be provided on the GND terminal side.

Furthermore, in the present embodiment, a memory cell transistor is used as a switch element, yet a bidirectional transistor may be used in order to reduce the cell area.

In the present embodiment, a tantalum oxide is used for variable resistance layer 85, yet equivalent advantageous effects can be yielded even if a tantalum-aluminum oxide (TaAlO) resulting from adding aluminum (Al) to a tantalum oxide is used.

Variation

Next, a variation of a principal part of the variable resistance nonvolatile storage device in the embodiment is to be described.

Figure 15:
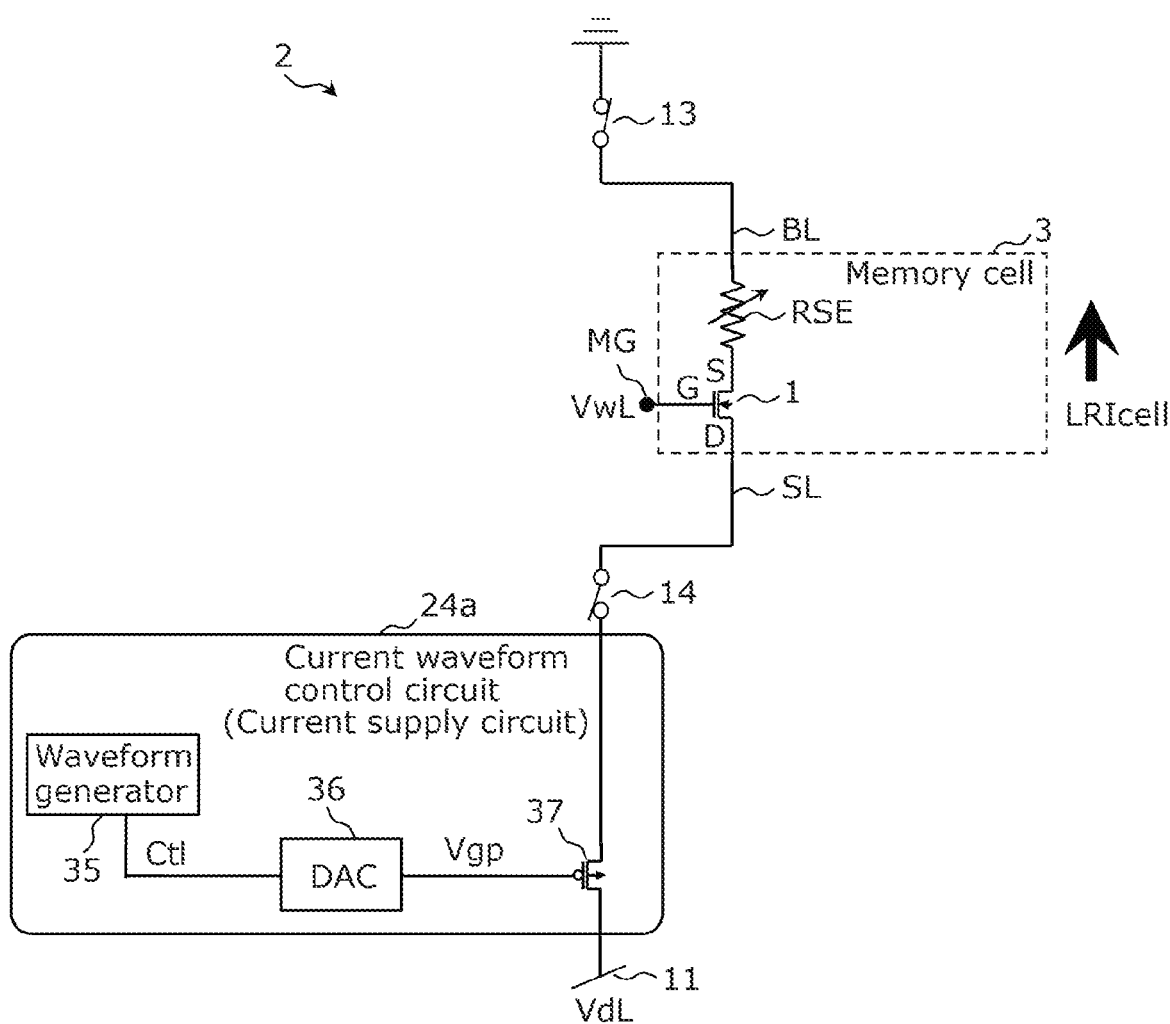
FIG. 15 illustrates a variation of the principal part of the variable resistance nonvolatile storage device in the embodiment.

FIG. 15 illustrates a variation of the principal part of the variable resistance nonvolatile storage device in the embodiment. Variable resistance nonvolatile storage device 2 in the drawing is different from the variable resistance nonvolatile storage device in FIG. 1A in that current waveform control circuit 24a is included instead of current waveform control circuit 24. The following description focuses on different points, while avoiding redundant description of the same points.

Current waveform control circuit 24a includes waveform generator 35, digital to analog converter (DAC) 36, and transistor 37.

Waveform generator 35 generates waveform data Ctl that is a digital signal indicating a current waveform of a low-resistance changing current. Waveform generator 35 includes ROM that stores therein time series sample values that indicate waveform data Ctl or a dedicated circuit, for example.

DAC 36 is a digital-analog conversion circuit that converts waveform data Ctl from waveform generator 35 into an analog signal. DAC 36 supplies a converted analog signal to the gate of transistor 37 as gate voltage Vgp.

Transistor 37 is a pMOS transistor that is a current source that supplies memory cell 3, via LR changing SL selection switch 14, with a low-resistance changing current having a waveform according to gate voltage Vgp.

Figure 16:
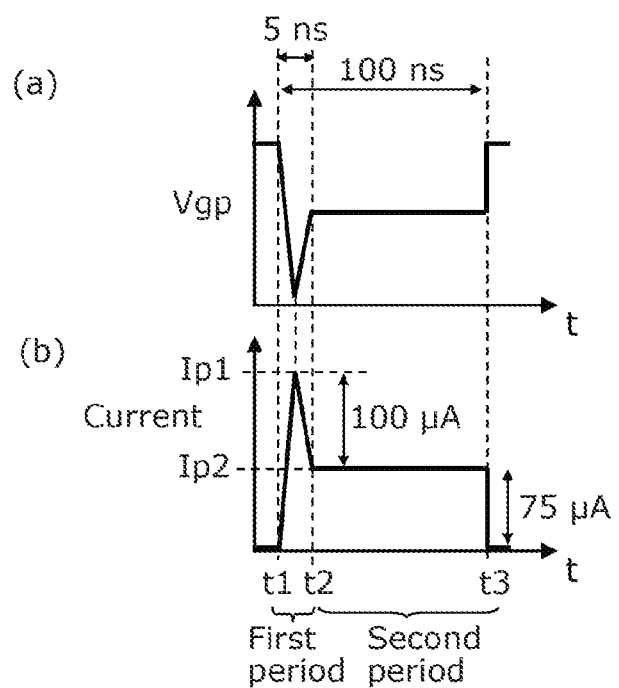
FIG. 16 illustrates variations of waveforms of a low-resistance changing current in the embodiment.

FIG. 16 illustrates variations of waveforms of a low-resistance changing current in the embodiment. Part (a) of FIG. 16 illustrates gate voltage Vgp output from DAC 36 to the gate of transistor 37. A current in (b) of FIG. 16 shows a low-resistance changing current output from transistor 37. Since transistor 37 is a pMOS transistor, a low-resistance changing current has a waveform inverted with respect to a change in gate voltage Vgp.

A waveform of a low-resistance changing current has one first period and one second period subsequent to the first period. A portion of a low-resistance changing current corresponding to the first period is referred to as a first current. A portion of the low-resistance changing current corresponding to the second period is referred to as a second current. The first current in (b) of FIG. 16 is a delta wave, and has first peak current Ip1. The second current is a substantially constant current, and has current value Ip2 smaller than first peak current Ip1. The first current is not zero at time t2 when the first period ends, and second current Ip2 is not zero at time t2 when the second period starts. Thus, the first current does not fall down to zero from the peak in the first period, and the second current has a value that is not zero when the second period starts.

Even if the waveform of a low-resistance changing current is the one as illustrated in (b) of FIG. 16, advantageous effects as yielded in FIG. 1B can be yielded.

Furthermore, another variation of a waveform of a low-resistance changing current is to be described.

Figure 17:
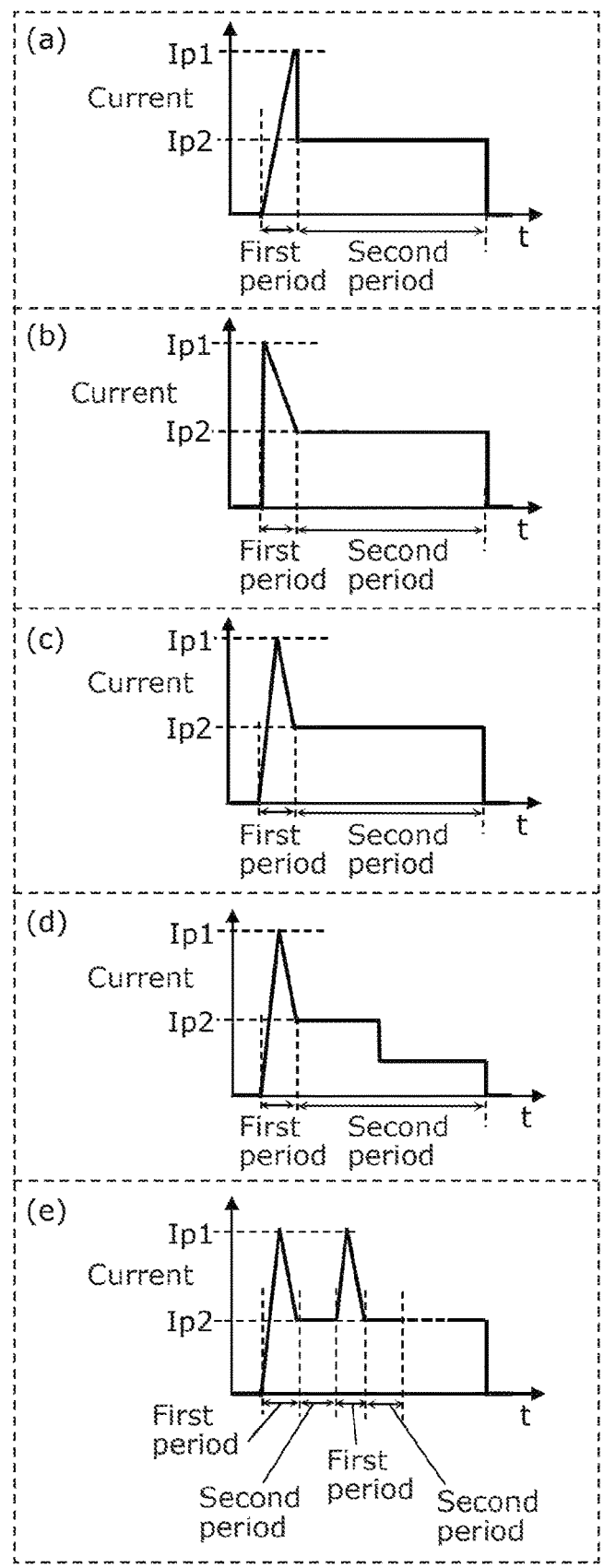
FIG. 17 illustrates other variations of a waveform of a low-resistance changing current in a variation of the embodiment.

FIG. 17 illustrates other variations of a waveform of a low-resistance changing current in the variation of the embodiment.

In the example in (a) of FIG. 17, the low-resistance changing current has a waveform shaped like a sawtooth waveform having a steep falling edge in the first period. The time width of the first period, the time width of the second period, peak value Ip1 of a first current, and second current Ip2 may be the same as FIG. 1B.

In the example in (b) of FIG. 17, the low-resistance changing current has a waveform shaped like a sawtooth waveform having a steep rising edge in the first period.

The example in (c) of FIG. 17 is the same as (b) of FIG. 16.

In the example in (d) of FIG. 17, a low-resistance changing current has a shape like a delta wave in the first period, and has a waveform that the second current decreases stepwise in the second period.

In the example in (e) of FIG. 17, a low-resistance changing current has two sets of the first period and the second period, each set being as shown in (c) of FIG. 17. The time width of the first period, the time width of the second period, peak value Ip1 of the first current, and second current Ip2 may not be the same as FIG. 1B.

As described above, variable resistance nonvolatile storage device 2 according to an aspect of the embodiment includes: a variable resistance element (RSE) having a state reversibly changeable between a high resistance state and a low resistance state; and current waveform control circuit 24a that is a current supply circuit that supplies the variable resistance element with a low-resistance changing current for changing the state from the high resistance state to the low resistance state. The low-resistance changing current has a waveform that includes a first period and a second period along a time axis, the second period being subsequent to the first period. Current waveform control circuit 24a applies to the variable resistance element: a first current during the first period; and a second current during the second period, the second current being smaller than the first current. The first current is not zero at an end of the first period, and the second current is not zero at a start of the second period.

According to this, in writing for changing a state from the high resistance state to the low resistance state, deterioration of an initial window can be reduced, and deterioration of an operation window can be reduced at the time of high cycling (when rewrite is performed 100,000 times, for example). For example, when an element is miniaturized, a stable rewrite operation that is highly reliable can be performed for a long period.

Here, the first current may be a constant current.

According to this, a constant current source can be used as current waveform control circuit 24a.

Here, the first current may have a peak value greater than a peak value of the second current.

According to this, current waveform control circuit 24a can use, as the first current, a current that is not a constant current.

Here, the waveform of the low-resistance changing current may be a descending step form.

According to this, current waveform control circuit 24a generates the first current and the second current as currents in a descending step form. According to this, deterioration of an initial window as stated above can be reduced, and deterioration of an operation window can be reduced at the time of high cycling (when rewrite is performed 100,000 times, for example).

Here, current waveform control circuit 24a that is the current supply circuit may supply the variable resistance element with: a first constant current during the first period; and a second constant current during the second period, the second constant current being smaller than the first constant current.

According to this, in writing for changing the high resistance state to the low resistance state, driving for reducing a constant current in two stages is performed. This driving is referred to as constant current two-stage decrease driving. This driving is suitable to generate a current having a descending step waveform as stated above. Note that with regard to periods for supplying a current, the present embodiment is not limited to having only the first period and the second period, and third, fourth, . . . , and nth periods may be additionally included.

Here, current waveform control circuit 24 that is the current supply circuit may include LR changing current limiting element 26 that is a first constant current source; and LR changing current limiting element 27 that is a second constant current source. The current supply circuit may generate: the first constant current by superimposing a constant current from the first constant current source and a constant current from the second constant current source during the first period; and the second constant current that is one of the constant current from the first constant current source or the constant current from the second constant current source during the second period.

According to this, a current having a greater value than that in the second period is supplied to the variable resistance element during the first period, and thus an initial window can be sufficiently ensured. A current having a smaller value than that in the first period is supplied to the variable resistance element during the second period, and thus deterioration of a window at the time of high cycling can be reduced.

Here, current waveform control circuit 24 that is the current supply circuit may further include: constant current control switch 31 that is a first switch connected in series to the first constant current source; and constant current control switch 32 that is a second switch connected in series to the second constant current source, and the current supply circuit may supply the variable resistance element with: the first constant current by placing both the first switch and the second switch in a conductive state during the first period; and the second constant current by placing one of the first switch or the second switch in a non-conductive state and placing a remaining one of the first switch or the second switch in the conductive state during the second period.

According to this, a descending step current waveform can be readily generated by the operation of the first switch and the second switch.

Here, the first period may be shorter than the second period.

According to this, an operation window can be increased during the first period when a relatively great first constant current is supplied, and deterioration of an operation window due to high cycling operation can be reduced during the second period when a relatively small second constant current is supplied.

Here, the first period may be at most 10 percent of the second period.

According to this, the operation window can be increased in a first period that is 10% or less of the second period.

Here, the first period may be at most 5 ns, and the second period may be at least 50 ns.

According to this, a write operation for changing the state to the low resistance state can be performed at high speed.

Here, the second constant current may be at most 60 percent of the first constant current.

According to this, a write operation for changing the state to the low resistance state can be performed using less power.

Here, the first constant current may be at least 125 µA, and the second constant current may be at most 75 µA.

According to this, a write operation for changing the state to the low resistance state can be performed using less power.

Here, variable resistance element RSE may include: first electrode 81; second electrode 84 across from first electrode 81; and variable resistance layer 85 between first electrode 81 and second electrode 84, and variable resistance layer 85 may include a transition metal oxide.

Here, the transition metal oxide may include at least one of a tantalum oxide or a hafnium oxide.

Here, the variable resistance element may be disposed above a semiconductor substrate, and second electrode 84 may be more spaced apart from the semiconductor substrate than first electrode 81 is from the semiconductor substrate.

Here, the variable resistance nonvolatile storage device may further include: a plurality of memory cells disposed in a matrix. The plurality of memory cells may each include: a switch element; and the variable resistance element connected in series to the switch element.

Here, the switch element may be an NMOS transistor or a bidirectional diode.

A write method for a variable resistance nonvolatile storage device according to the embodiment is a write method for a variable resistance nonvolatile storage device that includes variable resistance element RSE that is a memory cell and has a state reversibly changeable between a high resistance state and a low resistance state, the write method being a method for changing the state of the variable resistance element from the high resistance state to the low resistance state, the write method including: supplying the variable resistance element with a first constant current during a first period; and supplying the variable resistance element with a second constant current during a second period subsequent to the first period, the second current being smaller than the first constant current.

According to this, in rewriting for changing a state from the high resistance state to the low resistance state, deterioration of an initial window can be reduced, and deterioration of an operation window can be reduced at the time of high cycling. Thus, the method is suitable for miniaturization.

Note that the present disclosure also encompasses a variable resistance nonvolatile storage device and a write method for the device that are acquired by applying, to the embodiment, various modifications that may be conceived by those skilled in the art and combining arbitrary elements in the embodiment, without departing from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, according to the present disclosure, in a variable resistance nonvolatile storage device that includes a memory cell that includes a variable resistance element having a resistance that reversibly changes based on an electrical signal and a switch element such as a transistor, the number of times rewrite can be performed can be readily increased using a practical write control method and a practical circuit area, without significantly increasing the array area. Thus, the present disclosure is applicable to fabricate highly reliable memory.

The invention claimed is:

1. A variable resistance nonvolatile storage device comprising:
   a variable resistance element having a state reversibly changeable between a high resistance state and a low resistance state; and
   a current supply circuit that supplies the variable resistance element with a low-resistance changing current for changing the state from the high resistance state to the low resistance state,
   wherein the low-resistance changing current has a waveform that includes a first period and a second period along a time axis, the second period being subsequent to the first period,
   the current supply circuit applies to the variable resistance element:
      a first current during the first period; and
      a second current during the second period, the second current being smaller than the first current,
   the first current is not zero at an end of the first period, and the second current is not zero at a start of the second period.

2. The variable resistance nonvolatile storage device according to claim 1,
   wherein the first current is a constant current.

3. The variable resistance nonvolatile storage device according to claim 1,
   wherein the first current has a peak value greater than a peak value of the second current.

4. The variable resistance nonvolatile storage device according to claim 1,
wherein the waveform of the low-resistance changing current is a descending step form.

5. The variable resistance nonvolatile storage device according to claim 1,
wherein the current supply circuit supplies the variable resistance element with:
a first constant current during the first period; and
a second constant current during the second period, the second constant current being smaller than the first constant current.

6. The variable resistance nonvolatile storage device according to claim 5,
wherein the current supply circuit includes:
a first constant current source; and
a second constant current source, and
the current supply circuit generates:
the first constant current by superimposing a constant current from the first constant current source and a constant current from the second constant current source during the first period; and
the second constant current that is one of the constant current from the first constant current source or the constant current from the second constant current source during the second period.

7. The variable resistance nonvolatile storage device according to claim 6,
wherein the current supply circuit includes:
a first switch connected to the first constant current source; and
a second switch connected to the second constant current source, and
the current supply circuit supplies the variable resistance element with:
the first constant current by placing both the first switch and the second switch in a conductive state during the first period; and
the second constant current by placing one of the first switch or the second switch in a non-conductive state and placing a remaining one of the first switch or the second switch in the conductive state during the second period.

8. The variable resistance nonvolatile storage device according to claim 1,
wherein the first period is shorter than the second period.

9. The variable resistance nonvolatile storage device according to claim 1,
wherein the first period is at most 10 percent of the second period.

10. The variable resistance nonvolatile storage device according to claim 1,
wherein the first period is at most 5 ns, and
the second period is at least 50 ns.

11. The variable resistance nonvolatile storage device according to claim 5,
wherein the second constant current is at most 60 percent of the first constant current.

12. The variable resistance nonvolatile storage device according to claim 5,
wherein the first constant current is at least 125 µA, and the second constant current is at most 75 µA.

13. The variable resistance nonvolatile storage device according to claim 1,
wherein the variable resistance element includes:
a first electrode;
a second electrode across from the first electrode; and
a variable resistance layer between the first electrode and the second electrode, and
the variable resistance layer includes a transition metal oxide.

14. The variable resistance nonvolatile storage device according to claim 13,
wherein the transition metal oxide includes at least one of a tantalum oxide or a hafnium oxide.

15. The variable resistance nonvolatile storage device according to claim 13,
wherein the variable resistance element is disposed above a semiconductor substrate, and
the second electrode is more spaced apart from the semiconductor substrate than the first electrode is from the semiconductor substrate.

16. The variable resistance nonvolatile storage device according to claim 1, further comprising:
a plurality of memory cells disposed in a matrix,
wherein the plurality of memory cells each include:
a switch element; and
the variable resistance element connected in series to the switch element.

17. The variable resistance nonvolatile storage device according to claim 16,
wherein the switch element is an NMOS transistor or a bidirectional diode.

18. A write method for a variable resistance nonvolatile storage device that includes a variable resistance element that is a memory cell and has a state reversibly changeable between a high resistance state and a low resistance state, the write method being a method for changing the state of the variable resistance element from the high resistance state to the low resistance state, the write method comprising:
supplying the variable resistance element with a first current during a first period; and
supplying the variable resistance element with a second current during a second period subsequent to the first period, the second current being smaller than the first current,
wherein the first current is not zero at an end of the first period, and
the second current is not zero at a start of the second period.

* * * * *